(12) United States Patent
Petrovic et al.

(10) Patent No.: US 7,386,286 B2
(45) Date of Patent: Jun. 10, 2008

(54) HIGH FREQUENCY LOW NOISE PHASE-FREQUENCY DETECTOR AND PHASE NOISE REDUCTION METHOD AND APPARATUS

(75) Inventors: Branislav Petrovic, La Jolla, CA (US); Maxim Ashkenasi, La Jolla, CA (US)

(73) Assignee: Broadband Innovations, Inc., San Diego, CA (US)

( * ) Notice: Subject to any disclaimer, the term of this patent is extended or adjusted under 35 U.S.C. 154(b) by 450 days.

(21) Appl. No.: 11/220,399

(22) Filed: Sep. 7, 2005

(65) Prior Publication Data

US 2006/0057996 A1    Mar. 16, 2006

Related U.S. Application Data

(63) Continuation-in-part of application No. 11/004,992, filed on Dec. 7, 2004, now Pat. No. 6,982,592, which is a continuation of application No. 09/872,143, filed on Jun. 1, 2001, now Pat. No. 6,847,255.

(51) Int. Cl.
    *H04B 1/18* (2006.01)
(52) U.S. Cl. .................. 455/165.1; 455/260; 455/255; 455/264; 329/323
(58) Field of Classification Search ............ 455/165.1, 455/260, 264, 255; 329/323
    See application file for complete search history.

(56) References Cited

U.S. PATENT DOCUMENTS

| 4,336,505 | A |   | 6/1982  | Meyer ....................... 331/1 R |
|-----------|---|---|---------|---------------------------------------|
| 4,918,405 | A |   | 4/1990  | Herleikson ................... 331/11 |
| 4,918,747 | A |   | 4/1990  | Bekooij ..................... 455/617 |
| 4,994,767 | A |   | 2/1991  | Hawkes ...................... 332/123 |
| 5,412,351 | A | * | 5/1995  | Nystrom et al. ............ 332/103   |
| 5,584,068 | A | * | 12/1996 | Mohindra .................... 455/324 |
| 5,661,439 | A |   | 8/1997  | Watkins et al. ............. 331/1 R  |
| 6,516,183 | B1| * | 2/2003  | Hellmark ...................... 455/78 |

* cited by examiner

Primary Examiner—Sanh D. Phu
(74) Attorney, Agent, or Firm—Larry T. Cullen

(57) ABSTRACT

The present invention discloses a new type of extremely low-noise phase-frequency detector (PFD) 500, broadband from DC to multi-GHz RF frequencies for PLL synthesizer applications. Free of any feedback mechanisms, thus inherently fast, it operates close to transition frequency $f_T$ of IC processes or frequency limits of discrete mixers. The PFD 500 utilizes complex SSB conversion in both the in-phase and quadrature arms, delaying the in-phase arm in 530, beating the delayed signal 124 with the un-delayed quadrature signal 122 in mixer 126. The output 128 contains both the frequency difference and the phase difference information between the two signals 118 and 520, providing both the frequency-discrimination (FD) and the phase detection (PD) functions. Utilizing standard mixers the PFD 500 can achieve superior CNRs of 180 dBc/Hz at multi-GHz RF. Additionally, utilizing the FD/FM demodulation capability, the present invention improves phase noise of various signals and linearity of FM modulators.

28 Claims, 22 Drawing Sheets

HIGH FREQUENCY LOW NOISE PHASE-FREQUENCY DETECTOR AND PHASE NOISE REDUCTION METHOD AND APPARATUS

CROSS REFERENCE TO RELATED APPLICATIONS

This application is a continuation-in-part of application Ser. No. 11/004,992, filed Dec. 7, 2004 now U.S. Pat. No. 6,982,592, allowed, which is a continuation of application Ser. No. 09/872,143, filed Jun. 1, 2001, now U.S. Pat. No. 6,847,255, the entire contents of which are hereby incorporated by reference.

BACKGROUND OF THE INVENTION

1. Field of the Invention

This invention also relates to a new type of extremely low noise Phase/Frequency Discriminators/Detectors (PFD) providing significant advantages over prior art in frequency acquisition, phase locking/tracking and other applications, as well as FM demodulators employed in techniques for phase noise improvements of oscillators and other signals and sources and in highly linear FM modulators.

2. Background of the Related Art

Communication and other electronics systems use internally generated signals for various functions. Such signals are often generated by local oscillator sources for purposes of signal frequency up or down conversion, modulation/demodulation, as well as for various clock signals used by processors and controllers. It is often required that these signals have high spectral purity and low phase noise. Low phase noise is particularly important in communication systems using phase or frequency modulation schemes such as quadrature amplitude modulation (QAM) (which is used in digital cable TV and high speed data modems), quadrature phase modulation (QPSK) (which is used in digital cellular telephony), FM modulation (which is used in analog cellular telephony), and other similar modulation formats employed in other communication systems.

It is well known in the art that frequency synthesizers play a key role in generation of such high quality signals. It is also well known that a frequency discriminator (or frequency comparator) is an integral part of frequency synthesizers. A general discussion of phase lock loop (PLL) based frequency synthesizers is found in aforementioned commonly assigned U.S. patent application Ser. No. 09/580,513 entitled "Rational Frequency Synthesizers" which is incorporated herein in its entirety by this reference. As discussed therein, to achieve low phase noise, it is important to operate the synthesizer at high comparison frequencies. The comparison frequency in PLLs is the frequency at which the comparison (or detection) of the phase and frequency of the scaled versions of both the oscillator and reference signals actually occurs. The undesired noise originating in dividers and phase detector will be multiplied by the loop by a factor equal to the total division ratio in the loop. The multiplied noise will then phase modulate the voltage controlled oscillator (VCO) and will significantly degrade and limit its phase noise performance. This noise multiplication is often the key factor causing degradation of phase noise performance in synthesizers. Thus, to achieve low phase noise performance, it is important to keep the multiplication factor low, i.e., the comparison frequency high.

In a PLL frequency synthesizer, a frequency lock must occur before a phase lock can occur. During acquisition of the phase lock, the phase detector (PD) alone may not be able to provide an adequate steering signal necessary for locking, and additional means for assisting the frequency acquisition is often necessary. For the purpose of assisting, or enabling acquisition, various means are utilized, such as a frequency discriminator (FD) also called frequency detector, or other means such as frequency pre-tuning or frequency sweeping. In the acquisition process, the FD (or one of the aforementioned other means) provides a DC steering signal of the right polarity, consistent with the sense of the frequency difference which guides the oscillator in the right direction towards a frequency lock, or at least until the frequency falls inside the capture range of the PD. Thereafter, the PD is once again relied upon to keep the PLL phase-locked. As part of a negative feedback loop, the FD must provide a high (e.g., positive) voltage when the frequency at one input is higher than the other and a low (e.g., zero) voltage when the frequency at that input is lower than the other.

Among all methods used to perform this function the FD is by far the most commonly used means for frequency acquisition in PLL frequency synthesizers. The frequency discriminators of the prior art used in frequency synthesizers are inherently limited in speed. They utilize flip-flops with their reset line being fed back from the output, as illustrated in FIGS. 6A and 6B. The relatively long propagation delays and settling times of the flip-flops limit the maximum speed (or frequency) of the FD operation, and thus indirectly limits the maximum comparison frequency in a PLL employing such an FD.

FIGS. 6A and 6B show typical circuits used in the industry, which accomplish a combined PD and FD function, being the phase-frequency detection (PFD). They are the Dual-D and the Quad-D Flip-Flop PFDs respectively. These circuits are implemented with conventional logic, and often found in digital bi-polar or CMOS integrated circuits. The outputs of these PFDs need to drive a charge pump operating in conjunction with an external LPF or integrator. The charge pump (not shown in the figures) typically consists of a voltage-controlled current source that outputs either a positive or a negative current depending on the value of the control voltages (UP and DN lines). When UP and DN are equal the output current should be zero. When the frequency of one input is different from the other, the UP or the DN lines engage to pull the VCO frequency in the desired direction.

The limitations of these flip-flop based circuits are mainly related to speed (i.e., to the maximum operating frequency). Their physical limitations are the set-up and hold times of the flip flops, the propagation delays from their Clock, Reset and D inputs to the outputs, as well as the usual propagation delays of the combinatorial logic and their interconnections. Those limitations produce two types of artifacts associated particularly with the phase-detection, namely the "dead-zone" and the "blind-spot". The "dead zone" is the region where the phases of the two input signals (F.sub.ref and F.sub.in) produce a close to zero error that goes undetected. The phase range of the dead zone is in the order of the phase delay caused by one or two units of propagation delays of the gates. To minimize this effect it would be necessary to reduce the compared frequencies until the phase error associated with this zone becomes insignificant. The "blind-spot" is the region where the phase difference approaches plus or minus 3600, in which the edges of every next cycle occurs during the resetting pulse to the PD flip-flops. This imposes the same type of speed limitations as the "dead zone". In a typical CMOS integrated circuit having typical gate and flip-flop delays of few nano-seconds and gate delays of few hundred pico-seconds, the maximum workable frequency might be well below 30 MHz for the phase-detection and not more than 60 MHz for the frequency discriminator.

Another disadvantage of performing phase detection using one of those PFDs is that they are quite noisy, and require a charge pump with a relatively narrow low-pass filter (or integrator) because the phase correction pulses to the charge pump may occur at very low frequencies. The frequency detection, although somewhat better in the Quad-D topology of FIG. 6B than that of the Dual-D of FIG. 6A, suffers from the same speed limitations as the phase detection. Scaling the input frequencies prior to the PFD would lessen the speed constraints. For example using a divider by N prior to both the F.sub.ref and F.sub.in inputs would make the PFD operate at 1/N times the frequency. While the FD function of the PFD would not suffer significantly by this scaling, the PD function would: operation at one Nth of the frequency would increase the PLL phase noise power contribution significantly as discussed earlier by increasing the total division ratio in the loop (usually between a factor of N and N.sup.2). If the PLL phase noise is of the essence for a given design, then the PD needs to be capable of operating at higher comparison frequencies, so that N would be minimal. One such circuit would be a simple logic exclusive-OR gate, also known as XOR. Since this type of phase detector cannot perform the FD function, this function would need to be implemented separately.

Another disadvantage of the prior art FDs is that their gain (expressed in Volts/Hz) is low, and cannot be controlled. It can be seen from the transfer function outlined in FIG. 6C that when F.sub.ref and F.sub.in are within an octave of each other the gain is at its highest but it is still limited to Vcc/F.sub.ref. The consequence is that when F.sub.ref and F.sub.in are very close to each other (i.e., close to lock condition) the steering voltage output (around ½ Vcc) would be extremely small, potentially slowing down the acquisition speed.

It should be noted that frequency discrimination is very similar to frequency demodulation. The frequency discriminator in synthesizer applications compares a frequency of interest to a reference frequency and produces a difference, or error signal. This signal must have the right polarity (sign), but does not need to be linearly proportional to the frequency difference of the two frequencies. For example, the error signal can be a bi-level signal, where one level corresponds to negative difference and the other to positive difference of the two frequencies, effectively providing a frequency comparator function. An FM demodulator, on the other hand, also needs to produce the difference (error) signal, but this time the error signal must be linearly proportional to the frequency difference. Increasing the demodulator gain to an extreme, the proportional signal can approach the bi-level signal. Further, a discriminator must operate down to DC frequency (DC coupled), while a demodulator may not have to operate down to DC, but often only down to some low frequency (AC coupled demodulator). In summary, a frequency discriminator can be viewed as a special case of a demodulator, i.e., as a high gain, DC coupled FM demodulator.

To provide better insight into the operation of frequency demodulators and discriminators of the present art, the analytical background of FM modulation and demodulation is reviewed below.

A Frequency Modulated (FM) waveform can be expressed as:

$$FM(t)=\cos[\omega_c t + \phi(t)] \quad (1)$$

where:
.omega..sub.c—FM carrier frequency
.phi.(t)=k.sub.v.intg.m(t)dt—instantaneous phase (or angle, argument) of the waveform
.phi.'(t)=k.sub.vm(t)=.delta..omega.(t)—instantaneous frequency deviation
m(t)—modulation signal, i.e., base band (BB) information
k.sub.v—constant of proportionality in the FM modulator
i.e., in FM modulation, instantaneous frequency deviation .delta..omega.(t) of the carrier is proportional to the modulation signal m(t), while the instantaneous phase .phi.(t) is a time integral of the instantaneous frequency deviation .delta..omega.(t).

Because the argument .phi.(t) of the FM waveform represents a time integral of the modulation signal m(t), it follows that demodulation of an FM signal is a reverse process, where a derivative of the FM argument with respect to time contains the demodulated information:

$$1\ BB(t)=k'(t)=kt[(t)]=kt[kvm(t)t]=kkvm(t) \quad (2)$$

where BB(t) is a demodulated FM baseband signal, equal (within a constant k.multidot.k.sub.v) to the modulation signal m(t); k is a constant of proportionality in the demodulator and k.sub.v is a constant of proportionality in the modulator.

From equation (2) it follows that in order to demodulate an FM waveform, a demodulator must involve the operation of differentiating the argument of the FM waveform with respect to time. Different types of FM demodulators differ from each other in the manner in which this function is accomplished. In general, the differentiation of the argument of FM waveform can be accomplished by hardware, by digitization & computation (i.e., by Digital Signal Processing—DSP) or by the combination of the two.

In the computational approach, instantaneous samples of the argument of the FM signal are obtained (at a sampling rate equal or higher than the Nyquist rate), the samples are digitized and the time derivative is computed, yielding demodulated information. This approach is limited to lower FM carrier frequencies, where the limitation is imposed by analog to digital converters (ADC) speed, as well as by the computational speed. The ADC speed limitation problem can be overcome to some extent by "undersampling" (i.e., where the sampling rate is lower than the FM carrier frequency, but higher than twice the maximum modulation frequency). In a combined approach, the FM signal can be down-converted to lower frequencies, or to zero intermediate frequency (IF), and then sampled and computationally processed.

The hardware approach to differentiating the argument of the FM waveform usually involves an approximation of this operation, implemented in hardware. Most hardware methods utilize, in one form or another, a mathematical approximation described below:

Starting with a definition of a first derivative of a function:

$$2'(t)=(t)t=(t)-(t-t)t \quad (3)$$

and multiplying eq. (3) by dt, the following expression is obtained:

$$.phi.(t)-.phi.(t-dt)=.phi.'(t)-dt \quad (4)$$

The dt is infinitesimally small increment of time. It can be approximated with a finite value of time, for example with a finite time delay $\tau$, provided that this time delay is small compared with the maximum rate of change of signal $\phi(t)$, i.e. $\tau \ll 1/f_{max}$, where $f_{max}$ is the highest frequency in the baseband modulation signal.

Approximating $dt \approxeq \tau$ in equation (4):

$$\phi(t) - \phi(t-\tau) \cong \tau \cdot \dot{\phi}(t) \qquad (5)$$

From equation (2), substituting $k=\tau$, it directly follows that eq. (5) represents a demodulated baseband signal:

$$BB(t) = \tau \cdot \dot{\phi}(t) = \phi(t) - \phi(t-\tau) = k \cdot k_v \cdot m(t) \qquad (6)$$

Equation (6) summarizes the outcome of the above approximate differentiation process. It states that the demodulated baseband signal can be obtained by finding a difference of the instantaneous phase of the FM waveform in the point of time $t$ and in a delayed point of time $t-\tau$.

To determine how small a time delay $\tau$ needs to be in respect to maximum frequency of the modulation signal $f_{max}$, a Laplace transform of equation (5) can be used. Applying the Laplace transform to the left hand side of eq. (5) yields:

$$L[\phi(t) - \phi(t-\tau)] = L[\phi(t)] - L[\phi(t-\tau)] =$$
$$\Phi(s) - \Phi(s) \cdot e^{-\tau s} =$$
$$\Phi(s)(1 - e^{-\tau s}) \qquad (7)$$

where $\Phi(s)$ is a Laplace transform of $\phi(t)$ and $s$ is a complex frequency variable $s = \sigma + j\omega$.

Approximating $e^{-\tau s}$ with a Taylor expansion around zero:

$$3 - s1 - s + (s)22 \qquad (8)$$

From eq. (8):

$$41 - -ss - (s)22 = (1-s2)s \qquad (9)$$

and substituting eq. (9) in eq. (7):

$$5\, L[(t)-(t-)](1-s2)s(s) \qquad (10)$$

Eq. (10) represents the Laplace transform of the left-hand side of eq. (5). Comparing this equation with the Laplace transform of the right hand side of eq. (5):

$$L[\tau \cdot \phi(t)'] = \tau \cdot s \cdot \Phi(s) \qquad (11)$$

it follows that the two sides of eq. (5) are equal, provided that $$6\, s21 \qquad (12)$$

This term represents the error (or distortion) caused by the approximation $dt \approxeq \tau$. For instance, if $s = \omega_{max}$ (highest modulation frequency), and allowing for 1% (0.01) distortion in the demodulated signal, the maximum acceptable delay can be computed from eq. (13):

$$7\, max\, 2\, 0.01\, 0.02\, max = 0.02\, 2\, f\, max = 0.01\, f\, max \qquad (13)$$

Audio FM demodulator example:

$f_{max} = 20$ kHz and from eq. (13) it follows that the maximum acceptable delay for 1% distortion is:

$$8\, max\, 0.01\, 20\, kHz = 0.16\, s \qquad (13a)$$

A widely used hardware implementation utilizing time delay per the concept above is a well known quadrature FM demodulator of the related art, illustrated in FIG. 1. The modulated FM signal 10 is split two ways, one passed without delay and the other passed through a delay circuit 2 having a delay $\tau$. The phase shift of the delayed arm is adjusted for 90.degree. at FM carrier center frequency. The relative phases of the two arms are then compared in a phase comparator or phase detector 4, at the output of which, after passing through low-pass filter 6, demodulated baseband signal BB(t) is obtained.

The output 8 of the demodulator of FIG. 1, considering fundamental frequency terms only, can be expressed as:

$$BB(t) = FM(t) \cdot FM(t-\tau) = \cos[\omega_c t + \phi(t)] \cdot \cos[\omega_c(t-\tau) + \phi(t-\tau)] \qquad (14)$$

Using a trigonometric identity for product of two cosines:

$$9\, \cos A \cos B = 12 \cos(A-B) + 12 \cos(A+B) \qquad (15)$$

and applying identity (15) to equation (14):

$$10\, BB(t) = 12 \cos[(t)-(t-)+c] + 12 \cos[2\, ct - c + (t) + (t-)] \qquad (16)$$

The low pass filter (LPF) 6 at the output of the mixer removes the sum frequency and all higher frequency terms, and for $\omega_c \tau = -90\degree$ (or odd multiples of 90.degree.) at the carrier frequency $\omega_c$, the output is:

$$11\, BB(t) = 12 \cos[(t)-(t)-90\degree] = 12 \sin[(t)-(t-)] \qquad (17)$$

Substituting $\phi(t) - \phi(t-\tau)$ with $\tau \cdot \phi'(t)$ from eq. (5):

$$12\, BB(t)12 \sin[\dot{}(t)] \qquad (18)$$

and substituting $\phi'(t) = k_v m(t)$ from eq. (1):

$$13\, BB(t)12 \sin[kvm(t)] \qquad (19)$$

Using small angle approximation of sine function:

$$\sin x \cong x \text{ for small } x\ (x \ll 1 \text{ radian}): \qquad (20)$$

Applying approximation (20) to equation (19):

$$14\, BB(t)12\, kvm(t) \text{---Demodulated signal at output 8} \qquad (21)$$

Equation (21) represents a demodulated signal in the FM demodulator of the related art. In this type of demodulator, delay $\tau$ is obtained with a tuned circuit (either with single or double tuned LC circuit, or with ceramic resonators). The delay must be small enough to achieve low distortion, per eq. (13). Furthermore, the delay must also produce a quadrature phase shift (90.degree.) at the center frequency $\omega_c$ (if the phase delay is not exactly 90.degree., the demod would still work, but at reduced performance).

The specific requirement for phase quadrature imposes a practical limit for the use of this demod to a fixed frequency. At that fixed center carrier frequency, the circuit is adjusted for a precise 90.degree. phase shift. An application example of this type of demod at fixed frequency is in FM stereo receivers. They use an IF frequency of 10.7 MHz, where a fixed tuned circuit (either a single tuned LC circuit, or a double tuned LC circuit with coupled coils) is used to obtain 900 phase shift at that frequency.

The problem of using this type of demodulator in frequency agile applications comes from the difficulty in achieving flat group delay and maintaining a 90.degree. phase shift over broader range of carrier frequencies $\omega_c$. Furthermore, this solution is not suitable for integration into integrated circuits (ICs), due to difficulties in implementing a required time delay and phase shift inside the integrated circuit.

Frequency agility has been resolved in another type of demodulator of the prior art, shown in FIG. 2. Instead of splitting and delaying the FM signal before the phase detector, as in the demodulator of FIG. 1, the FM signal 12 is first down-converted to zero IF frequency and then delayed, prior to phase comparison. In this type of demodulator, the FM signal 12 with carrier frequency ($\omega_c$ is split in two in-phase signals 14 and 16, and each signal is down-converted to zero IF frequency by mixing it with local oscillator (LO) 26 of frequency $\omega_0$. One of the in-phase signals (14) is mixed with zero phase LO signal 32 in mixer 18, producing the in-phase (I) output 22, while the other in-phase signal (16) is mixed with quadrature phase (−90°) LO signal 30 in mixer 20, producing quadrature (Q) output 24. The mixing process produces two sidebands—the lower sideband (LSB) having the difference frequency $\omega_c - \omega_0$ and the upper sideband (USB) having the sum frequency $\omega_c + \omega_0$, i.e., this mixing results in a double sideband (DSB) conversion. Each of the I and Q arms at the output of respective mixers contains DSB signals: the sum of the LSB and the USB components, as shown in FIG. 2, where the sign "−" designates the LSB sideband ($I^-$ or $Q^-$) and "+" designates the USB sideband ($I^+$ or $Q^+$).

For further processing, it is necessary to remove the undesired USB components from both arms. The low pass filter (LPF) 34 in I arm and LPF 36 in Q arm are used to accomplish this task: the upper sidebands are filtered out and desired lower sidebands $I^-$ (38) and $Q^-$ (40) at difference frequency $\omega_c - \omega_0$ are extracted. Both I arm 38 and Q arm 40 at the output of LPF filters are split two ways, one way delayed by $\tau$ (in delay circuit 42 for I arm and in 44 for Q arm) and the other way not delayed. Next, the cross-mixing of two pairs of signals follows (38 and 48 in mixer 52, and 40 and 46 in mixer 50). The summation, with the proper sign in the summing circuit 58 of the products 54 and 56 thereof is conducted, yielding baseband output 60 per equations below:

$$BB(t) = I^-(t-\tau) \cdot Q^-(t) - I^-(t) \cdot Q^-(t-\tau) \quad (22)$$

By substituting individual terms with respective trigonometric expressions and expanding eq. (22), it can be shown that the BB signal 60 at the output of FIG. 2 is equal to:

$$15 \; BB(t) = 14 \sin[(c-o) + (t) - (t-)] \quad (23)$$

The LO frequency $\omega_0$ does not need to be equal (or phase locked) to the FM carrier frequency $\omega_x$; however, it needs to be close enough, so that the difference frequency $\omega_c - \omega_0$ is around zero (zero IF) and all modulation sidebands fall within the pass-band of the LPF filter. Conversely, the LPF bandwidth needs to be high enough to pass the highest frequency of interest. In eq. (23) it is necessary to keep the argument small in order to achieve linear demodulation, in accordance with the to small angle approximation of $\sin x \cong x$ in eq. (20). This condition is met for $(\omega_c - \omega_0)\tau \cong 0$, i.e. $\omega_0 \cong \omega_c$. Using equations (17) through (20), the demodulated signal 60 at the output of FIG. 2 can be expressed with the following equation:

$$16 \; BB(t) \; 14 k v_m(t) \quad (24)$$

which is identical to eq. (21), except for a reduced level (by a factor of two).

While the solution of FIG. 2 resolves the frequency agility issue, it is still not suitable for integration into integrated circuits (ICs), due to difficulties in implementing low pass filters inside the ICs. Thus, external filters would have to be used, which would require a signal to exit the IC for external filtering, pass through a filter (the signal will at this point become an analog signal) and in the case of digital Ics, re-entry into the IC will be required through some type of a comparator that will convert the analog signal back to digital.

Also, the performance of the prior art circuit directly depends on the phase and amplitude balance of the LPFs 34 and 36 in the I and Q arms. Any amplitude and/or phase imbalance in the two paths 38 and 40 will cause degradation of the quality of the demodulated signal (i.e., the noise and distortion performance will degrade). This places additional burden on low pass filter design and implementation for the prior art.

Thus, considering the limitations of both frequency discrimination and frequency demodulation of the prior art, those of skill in the art will recognize the need for 1) an alternative solution for frequency discrimination, one that can operate at much higher comparison frequencies for application to frequency synthesizers, thereby substantially improving phase noise performance, and 2) an alternative solution for demodulation for application to FM demodulation, one that facilitates frequency agile operation, is simple in design and suitable for implementation in integrated circuits.

SUMMARY OF THE INVENTION

It is therefore an objective of the present invention to provide frequency discriminators or frequency comparators, having inherently faster topologies, that can operate at high comparison frequencies (i.e., on the order of 200 MHz for digital circuit implementation, consistent with the current state of the art in digital integrated circuits technology, but inherently not limited to this operating frequency, or in the GHz range with analog/RF integrated circuits), suitable for use in frequency synthesizer applications, requiring high comparison frequencies.

It is another objective of the present invention to provide FM demodulators which are frequency agile (i.e., tunable over a wide frequency range) and that can operate at high frequencies (same as in the first objective above), and suitable for use in FM receivers and similar applications.

It is further an objective of the present invention to utilize bi-level (digital) circuits to accomplish all functions, or, in the cases where it is not feasible due to the speed (i.e., utilize frequency) limitations of the current state of the art digital integrated circuit technology, use the combination of analog radio frequency (RF) and digital circuits in one embodiment of the invention, where analog functions can be implemented by using standard analog/RF integrated circuits, and digital functions can be implemented in any type of programmable logic devices (PLD), Field Programmable Gate Arrays (FPGA), or custom Application Specific Integrated Circuit (ASIC).

It is another objective to embody the present invention in a form suitable for integration on a single chip integrated circuit, with minimum required support circuitry, either digital-only IC, or as a mixed signal analog/digital IC.

It is yet another objective to provide in-circuit capability to control the operating frequency and/or time delay in the case of the frequency discriminator application, to set the FD operating frequency range and gain (Volts/Hz), where the gain can be set to much higher levels, or, in the case of FM demod applications, to adjust the gain of the FM demodulator.

It is yet another objective to allow a system design, where a PLL could be made to lock on an offset frequency, which differs from the reference frequency by an exact amount controlled by the design.

It is another objective of the present invention to provide an FD, which, in combination with an XOR phase detector and an appropriate switching mechanism will provide a less noisy PFD solution for low phase-noise PLL applications.

These and other objectives in the present invention are achieved by the complex SSB down-conversion to zero IF frequency and by other-means, which will be clear to those of skill in the art in view of the detailed description of the invention.

MHz/V and tunes over one octave, from below 1 GHz to above 2 GHz. The reference frequency is at 1 GHz. An active second order type loop filter is used, to achieve a loop bandwidth of about 1 MHz. In this setting, the present invention PFD is capable of frequency acquisition over a +/−1 GHz range, simulated by Spice with results presented in FIG. 28a and FIG. 28b.

Figure 27:
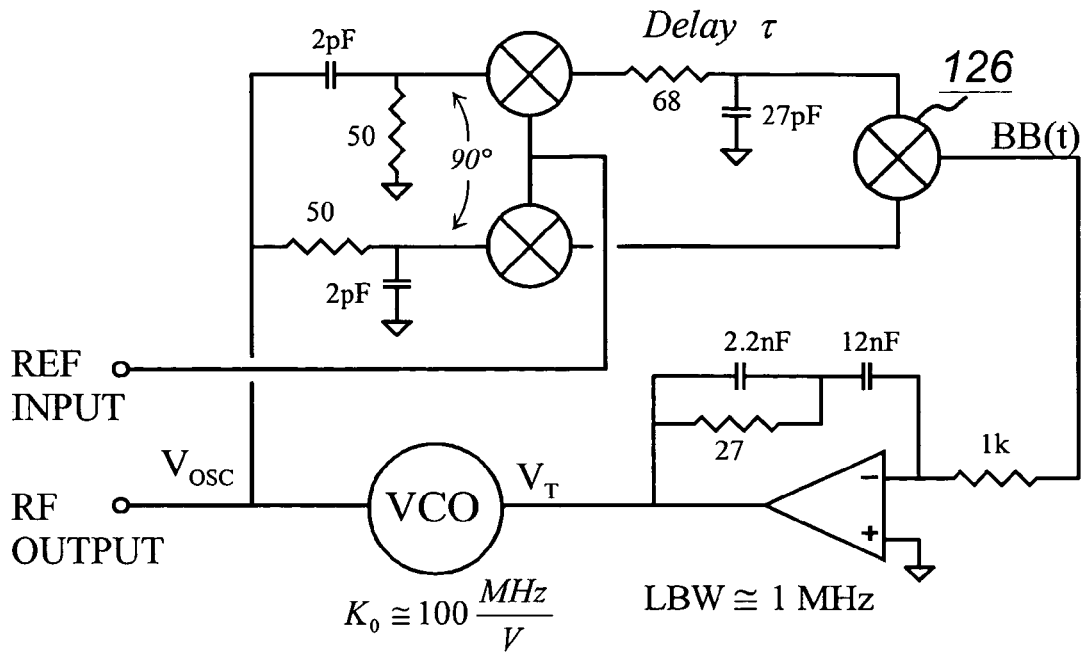
FIG. 27 illustrates one embodiment of the novel PFD circuit 560 within a PLL synthesizer system. The PFD circuit 560 is realized here as an RC implementation of the delay time τ and a simple first order RC lead-lag circuit, centered around 1.6 GHz, to obtain quadrature VCO signals. In this example, the VCO has a tuning sensitivity Ko of 100
Figure 28A:
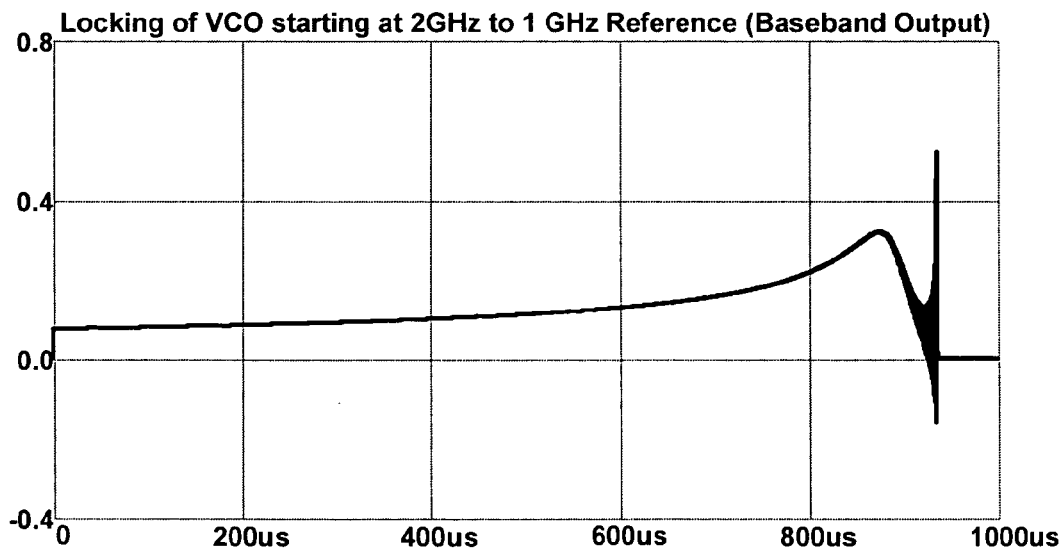

FIG. 28a plots Spice simulation results of the baseband signal BB(t) during frequency and phase acquisition of the PLL circuit of FIG. 27 for a case when a VCO of initial frequency of 2 GHz locks to a reference frequency of 1 GHz, simulating a frequency step of one octave.

Figure 28B:
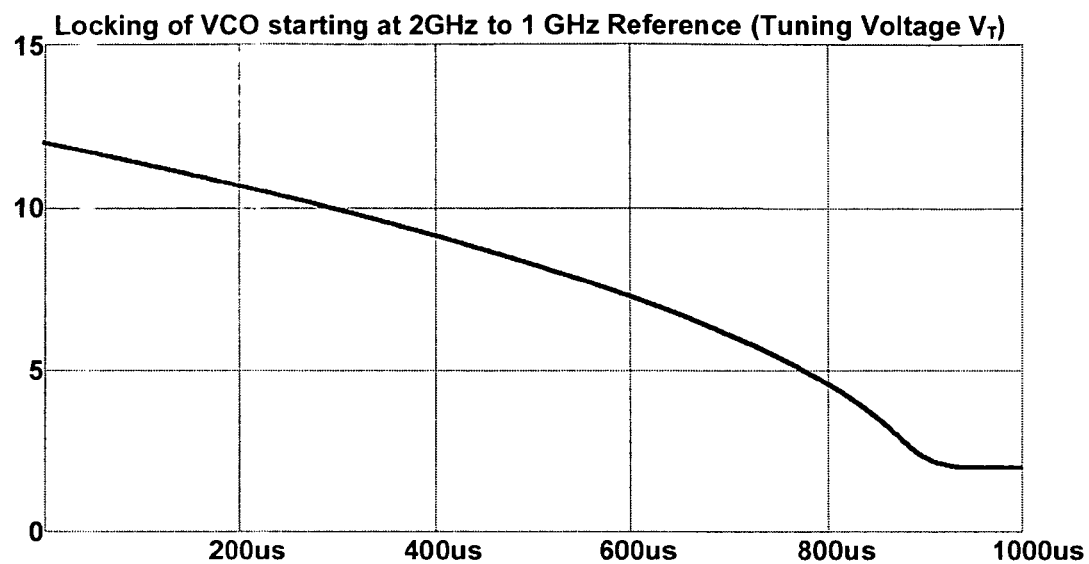

FIG. 28b is a Spice simulation of frequency and phase acquisition under the same conditions as in FIG. 28a, except the plot of the VCO tuning voltage $V_T$ is shown. As can be seen from these two simulation plots, the complete frequency and phase acquisition with the present invention PFD for an octave frequency change of 1 GHz takes about 950 us.

Figure 29:
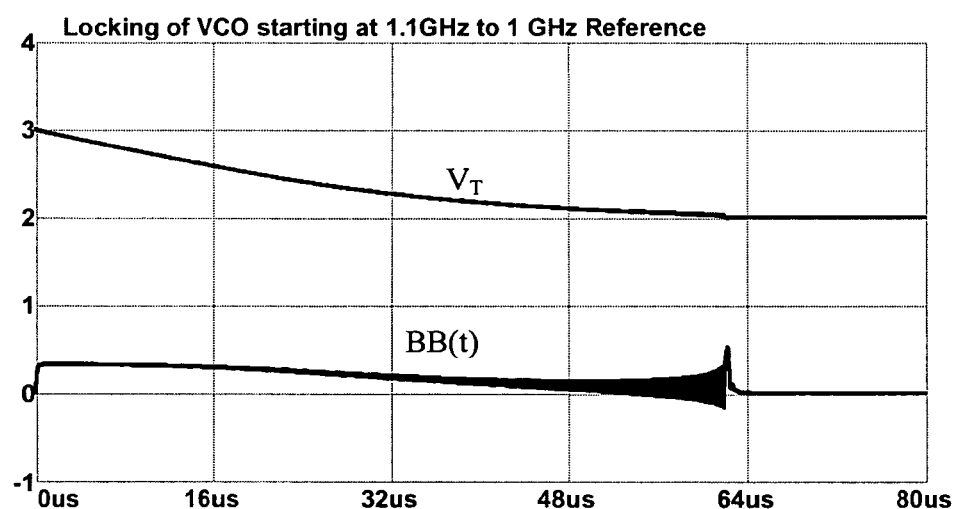

FIG. 29 plots Spice simulation results of the VCO tuning voltage $V_T$ and the baseband signal BB(t) during frequency and phase acquisition of the same PLL circuit of FIG. 27 utilizing present invention PFD, but for the case when the VCO starts from initial frequency of 1.1 GHz and locks to a 1 GHz reference, i.e., the plot simulates a frequency step of 100 MHz. In this case, the frequency/phase lock time is about 60 us.

Figure 30:
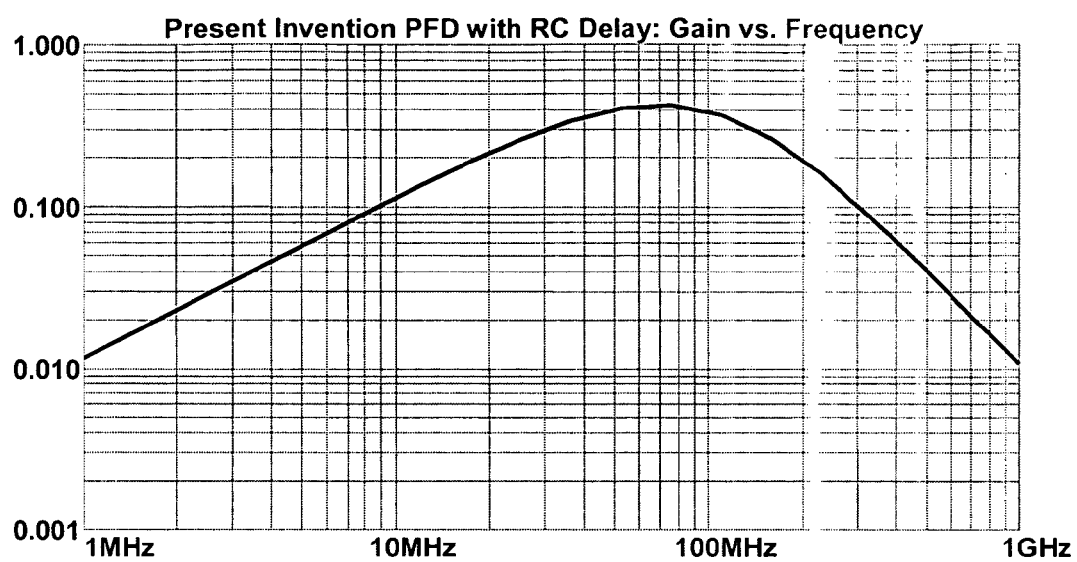

FIG. 30 is Spice simulation plot of the FD gain vs. offset frequency (i.e., the offset of VCO frequency in respect to the reference frequency) of the present invention PFD in circuit of FIG. 27, utilizing the RC implementation of the delay element. The simulation plot of the FD gain frequency response shows a peak around 80 MHz, which is close to the RC cut-off frequency of $1/(2\pi R(')$ The present invention FD circuit of FIG. 27 will be able to acquire any frequency for which the FD gain per FIG. 30 is above a minimum threshold. This threshold will depend on the total available loop gain and any possible DC offsets in the loop. The PLL example of FIG. 27 was designed with the FD loop gain threshold below 0.01, thus achieving the lower acquisition frequency below 1 MHz, and the upper above 1 GHz. The upper offset frequency of 1 GHz relative to the reference frequency of 1 GHz) presents a one octave acquisition capability of the present invention PFD.

DETAILED DESCRIPTION OF THE INVENTION

Figure 1:
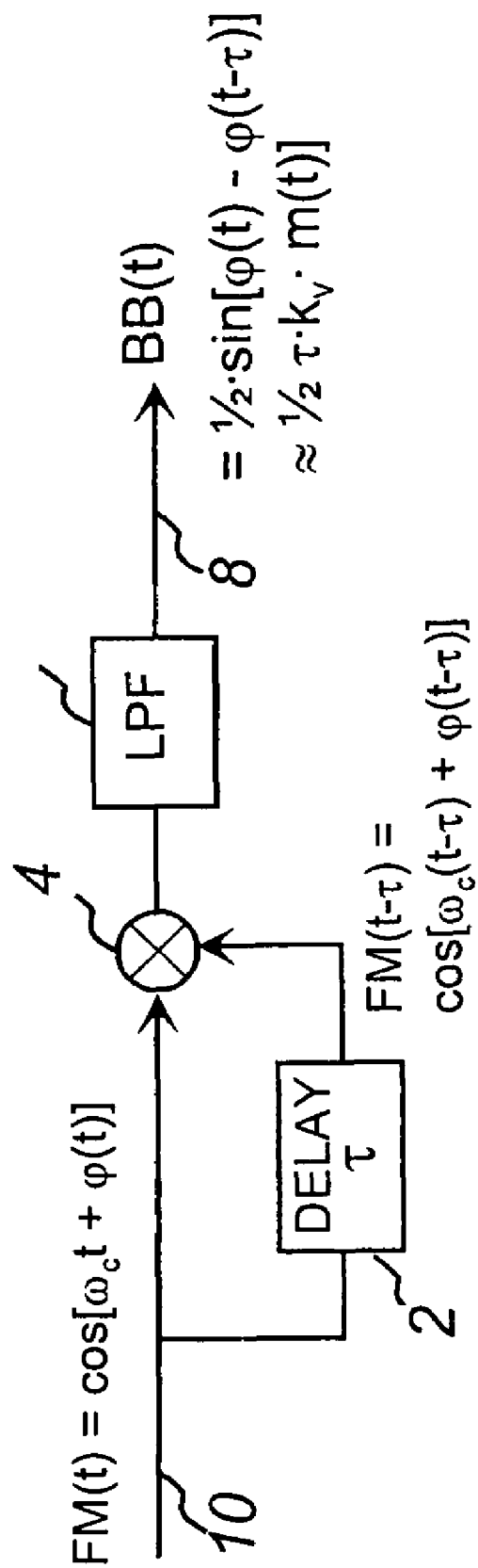
FIG. 1 is an illustration of the functional block diagram of a quadrature FM demodulator of the prior art.
Figure 2:
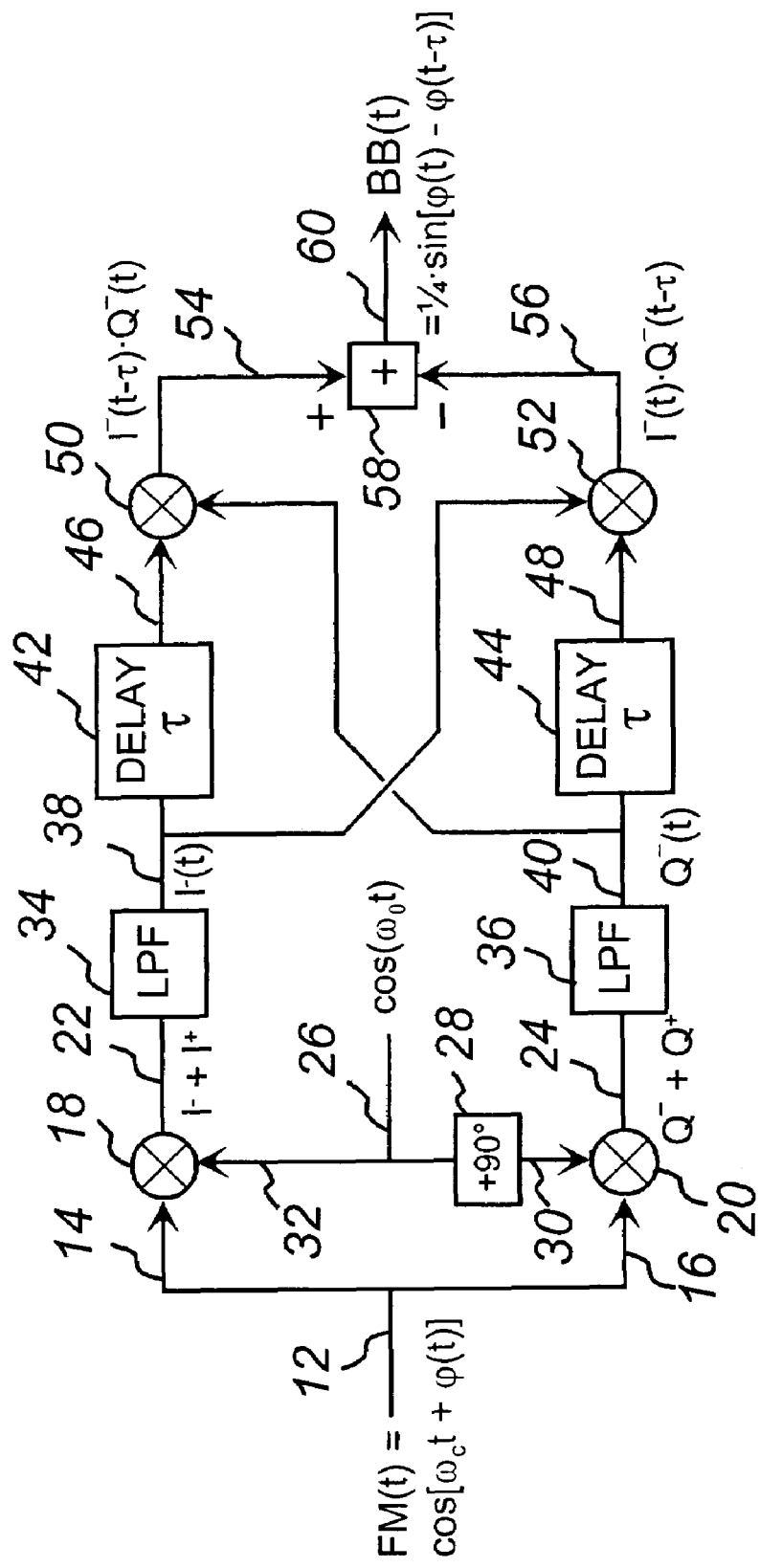
FIG. 2 is an illustration of the functional block diagram of an FM demodulator of the prior art, using complex double side-band (DSB) conversion to zero IF, where both in-phase (I) and quadrature (Q) down-conversion of FM signal to zero IF is utilized. Low pass filters for removal of upper sidebands at zero IF at both I and Q arms are necessary.
Figure 3:
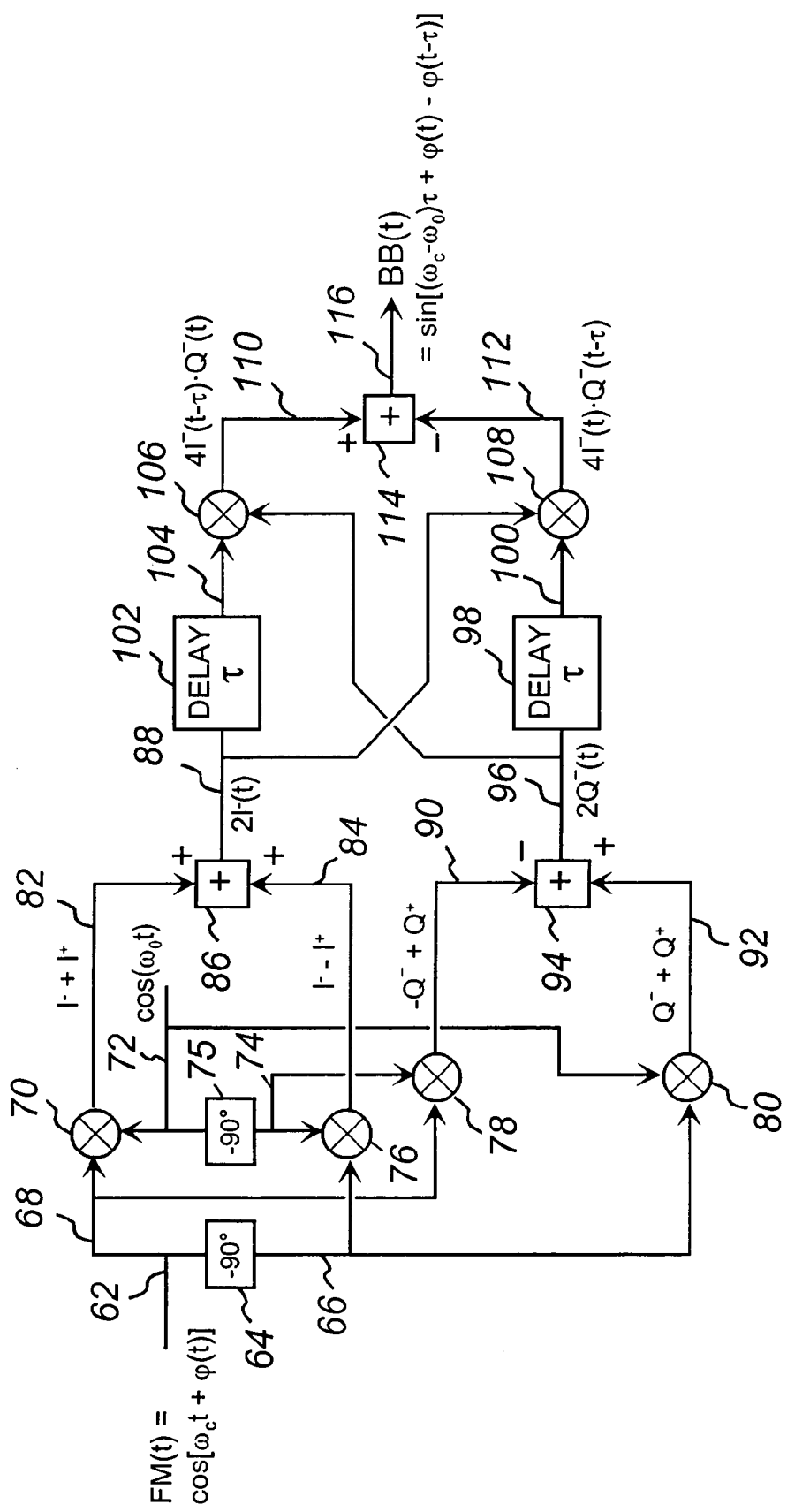
FIG. 3 is an illustration of the functional block diagram of one embodiment of the frequency discriminator and/or FM demodulator of the present invention, using complex single side-band (SSB) conversion to zero IF, where I and Q mixing of both in-phase and quadrature components of FM signal is utilized. Only one (lower) sideband at zero IF at each I and Q arms is produced. Low pass filtering for removing of the other (upper) sideband is not required in this embodiment.

To overcome the problem encountered in the prior art in FIG. 2 of having to filter with low pass filters both the I and Q arms, a complex single side-band (SSB) down-conversion to zero IF using in-phase (I) and quadrature signal (Q) shifted by 90.degree. can be used, as shown in one embodiment of the demodulator of the present invention in FIG. 3. The SSB mixing (also known as image rejection mixing) of two frequencies produces only one dominant frequency, equal to either the sum or the difference of the two frequencies, depending upon which sideband (upper or lower) is produced, which in turn is the function of the phasing of the quadrature components of the two frequencies. The complex SSB down-converter used in the present invention utilizes two sets of SSB mixers—one to produce the in-phase LSB signal, and the other to produce the quadrature LSB signal.

For complex SSB mixing, quadrature signals (0.degree. and 90.degree. phase signals) of both FM and LO signals are required. To obtain the phase shift of −90.degree. necessary for quadrature signals 66 and 74, either a delay line having a delay equal to 90.degree. phase shift at the operating frequency (which is not inherently broad-band, since a phase shift of a delay line will vary with frequency of the signal), or a divide-by-two or divide-by-four divider circuit can be used, as shown later in some of the embodiments of this invention.

In FIG. 3, the LO signal 72 is split into in-phase signals providing the LO drive for two mixers 70 and 80, and into quadrature signal 74 providing the LO drive for another two mixers 76 and 78. The FM signal 62 is also split into in-phase signal 68 feeding mixers 70 and 78, and quadrature signal 66 feeding mixers 76 and 80. Each mixer 70, 76, 78 and 80 produces DSB signals at its respective output, as a sum or a difference of its respective LSB and USB components, as indicated in lines 82, 84, 90 and 96 in FIG. 3.

Both the in-phase output 88 and the quadrature output 96 of the complex SSB mixer of FIG. 3 will contain only one sideband, either the lower sideband (LSB) or the upper sideband (USB), depending whether the phase of the quadrature component leads or lags the in-phase signal, and depending upon the sign of the adding circuit. In this application, the phasing is chosen for LSB sidebands: the output 82 of mixer 70 is combined (added) with output 84 of mixer 76 in a summing circuit 86, producing the in-phase baseband LSB signal 88. The output 90 of mixer 78 is combined (subtracted) with output 92 of mixer 80 in a summing circuit 94, producing the quadrature baseband LSB signal 96.

The output 88 of the in-phase arm of the complex SSB mixer can be expressed as:

$$(I.\sup.-+I.\sup.+)+(I.\sup.--I.\sup.+)=2I.\sup.-(t)=\cos[(.\omega..sub.c-.\omega..sub.0)t+.\phi.(t)] \quad (25)$$

Similarly, the output 96 of the quadrature arm can be expressed as:

$$(Q.\sup.-+Q.\sup.+)-(-Q.\sup.-+Q.\sup.+)=2Q.\sup.-(t)=\cos[(.\omega..sub.c-.\omega..sub.0)t+.\phi.(t)-90.\deg.] \quad (26)$$

Delaying each arm by .tau., generating the cross product signals 110 in mixer 106 and 112 in mixer 108, and subtracting these terms in the summing circuit 114:

$$BB(t)=4I.\sup.-(t-.tau.).\text{multidot}.Q.\sup.-(t)-4I.\sup.-(t).\text{multidot}.Q.\sup.-(t-.tau.) \quad (27)$$

Substituting eq. (25) and (26), and (t−.tau.) for t in eq. (27), and expanding individual terms, the demodulated signal 116 at the output can be computed:

$$BB(t)=\sin[(.\omega..sub.c-.\omega..sub.0).tau.+.\phi.(t)-.\phi.(t-.tau.)] \quad (28)$$

which is the same as equation (23), except with 4 times (or 12 dB) higher signal level.

In demodulator applications, (.omega..sub.c−.omega..sub.0).tau.=0.degree. (or multiples of 180.degree.), and the demodulated signal from eq. (28) is:

$$BB(t)=\sin[.\phi.(t)-.\phi.(t-.tau.)].\text{congruent}..tau.k.sub.vm(t) \quad (29)$$

In discriminator applications, .phi.(t)=0, and the output (DC error) signal from eq. (28) is:

$$DC=\sin[(.\omega..sub.c-.\omega..sub.0).tau.] \quad (30)$$

Figure 5:
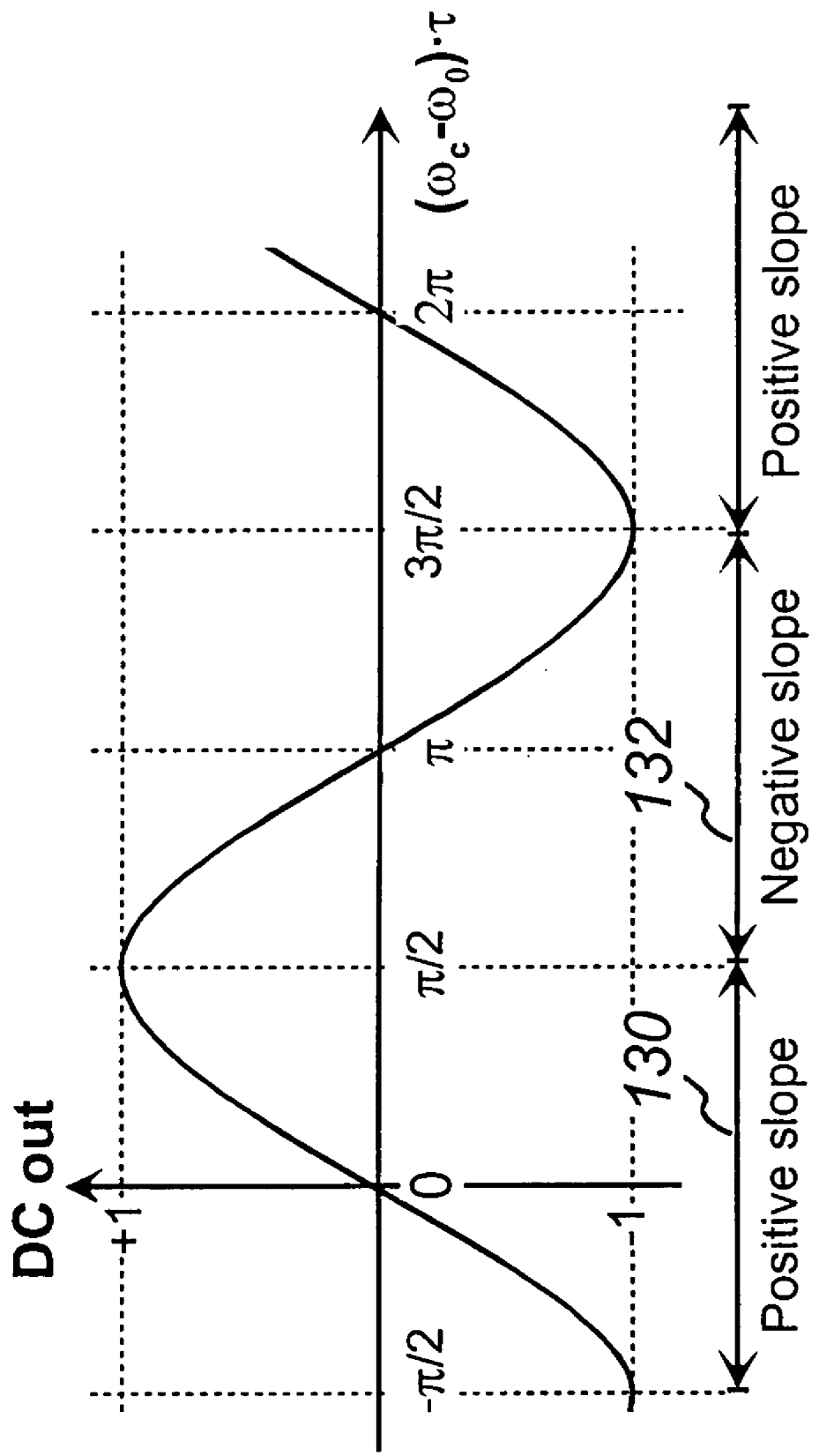
FIG. 5 is a plot of a discriminator output error function sin(.omega..sub.c−.omega..sub.0).tau., illustrating the polarity (sense) of this function as a function of the value of the argument, which is important to consider in frequency discriminator applications.

A plot of the discriminator output DC error function sin(.omega..sub.c−.omega..sub.0).tau. of equation (30) is shown in FIG. 5. The plot illustrates the polarity (sense) of this function as a function of the value of the argument. For arguments between −90.degree. and +90.degree. (argument range 130 in FIG. 5), the sense of the error function is positive. For arguments between 90.degree. and +270.degree. (argument range 132), the sense of the error function is negative. The sense alternates from positive to negative in 180.degree. intervals. This is important to consider in frequency discriminator applications, because the alternating polarity of the error function limits the frequency range for discriminators. Limiting the argument of eq. (30) to .+−..pi./2, it can be seen that the frequency range limit is in the order of ½.tau. For instance, if the delay is 50 ns, the discriminator frequency range is 10 MHz. The frequency range can be extended beyond this limit by changing (i.e., programming) the time delay .tau. This will be discussed further, in conjunction with some of the embodiments of the frequency discriminators of this invention.

Figure 4:
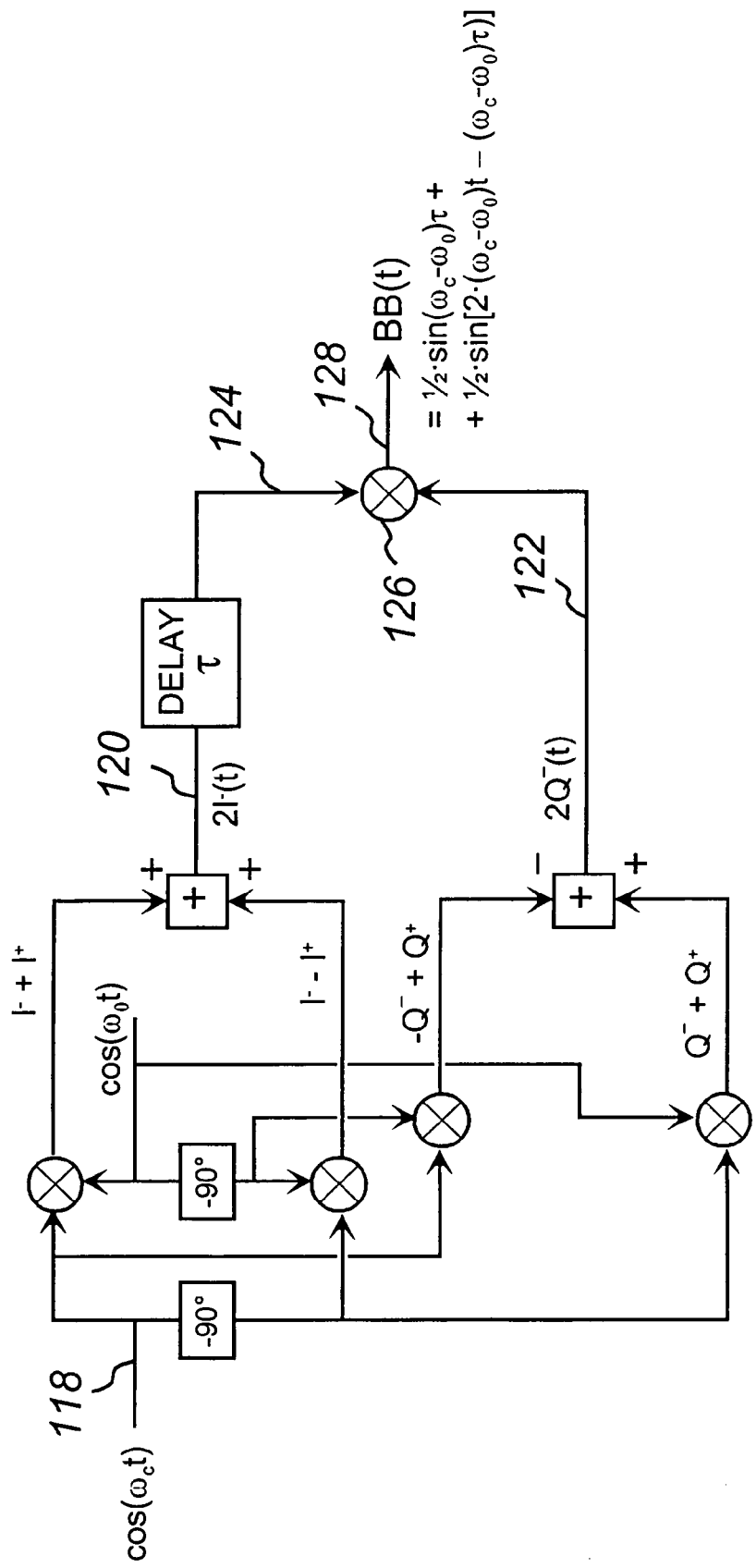
FIG. 4 is an illustration of a simplified embodiment of the present invention utilizing complex SSB conversion to zero IF, but with reduced complexity at the expense of somewhat reduced performance in frequency discriminator applications.

In some frequency discriminator applications, a simplified embodiment of the present invention, shown in FIG. 4, can be used. This embodiment also utilizes the complex SSB conversion to zero IF, but with reduced complexity at the expense of somewhat reduced performance. Here, only one delay circuit in the in-phase arm 120 is used. The quadrature signal 122 is multiplied with a delayed in-phase signal 124 in mixer 126, to produce output 128:

$$17\ BB(t)=12\ \sin\ [(c-o)]+12\ \sin\ [2(c-o)t-(c-o)] \quad (31)$$

The first part of eq. (31) contains a DC term, while the second part is a slow varying sine-wave signal. When the frequency .omega..sub.c approaches .omega..sub.0, equation (31) converges to zero, and the frequency discrimination function is achieved.

A phase detector or phase comparator is often realized as a multiplier or frequency mixer in analog implementation, or, for instance, as an XOR logic circuit in digital applications. The difference between a multiplier and a mixer is that in a multiplier both ports are linear, whereas in a mixer one port only is linear and the other port is highly nonlinear, acting as a signal limiter (or a signal clipper) and producing a square-wave (bi-level) switching signal (the limiting effectively converts an analog signal into a bi-level digital signal). In analog applications, the bi-level signal can have bipolar signal levels (e.g., +1 and −1), while in digital applications, the bi-level signal can assume only '0' and '1' logic levels, which are typically 0V and Vcc.

For FM demodulation, signals at both ports need to be limited, in order to eliminate any amplitude modulation (AM) or amplitude noise that may be present on the signal. The removal of AM modulation is necessary in order to prevent possible degradation of the FM demodulated signal due to amplitude attributes of the FM signal. The limiting of a signal is a non-linear operation, which generates harmonics of the signal. It can be shown that primarily odd order harmonics are generated ($3.\sup.rd$, $5.\sup.th$, etc.), because limiting produces an odd mathematical function (limiting is usually symmetrical in respect to signal polarity (i.e., the signal peaks and valleys are equally limited). The limiting can be performed with dedicated limiter circuits, but is usually accomplished by the multiplier/mixer itself, when provided with high enough signal levels.

As a consequence of harmonic generation due to limiting, the output of any of the above mentioned phase detectors will contain, in addition to the product of the two fundamental frequencies, also a product of all harmonic frequencies of the two signals. This is because the phase detector performs the operation of multiplying of the two signals in the time domain, which is equivalent to the operation of frequency mixing in the frequency domain (i.e., the output spectrum is equal to the convolution of the spectra of the two input signals). In general, all these spectral terms should be considered in an analysis of the FM demodulator. However, the analysis of the only fundamental terms is usually sufficient, as discussed below.

Phase detectors 106 and 108 in FIG. 3, depending on the implementation, will either receive already limited input signals or will perform the limiting of the respective input signals. These limited signals contain the fundamental frequency .omega..sub.c, as well as harmonic frequencies n.multidot..omega..sub.c, where n is the harmonic number. All of these frequency terms will participate in the mixing process and will produce some energy at the output of the mixer. The mixing of the fundamental frequencies will produce the dominant, desired term. The harmonics present at both mixer ports will beat with each other and produce numerous terms. The sum frequency terms will be low pass filtered, and the difference terms will produce low frequency terms. It can be shown that these identical low frequency terms produced by harmonic mixing contain the same signals to the desired terms, except with much lower amplitude. The amplitudes of the harmonic mixing terms are attenuated at the rate proportional to the square of the harmonic number $n.\sup.2$. As an example, the third harmonic, which is typically the strongest one after the fundamental, is attenuated by 20log3.sup.2=19 dB. It will contribute to the level of the desired signal by ⅓.sup.2=0.11, or 11%. The harmonic product terms will be added or subtracted from the desired term and will affect only the demodulated output signal level, or the demodulator gain, and therefore a simplified analysis of only the fundamental frequency products is usually accurate enough.

Figure 7:
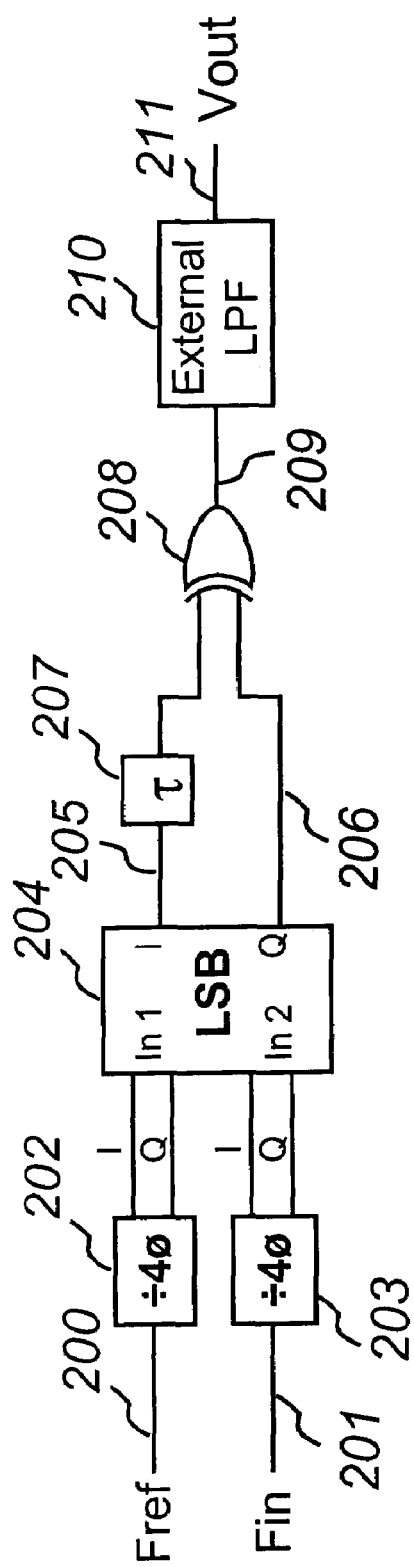
FIG. 7 depicts the block diagram of one embodiment of the present invention of a bi-level. Frequency Discriminator (FD).

A digital bi-level implementation as utilized in one embodiment of the present invention shown in FIG. 7, is now considered. Here, a bi-level frequency discriminator is presented using complex single side-band conversion to zero IF, which is free of the speed constraints associated with the prior art flip-flop based FDs, and is therefore capable of handling much higher frequencies. In addition, its gain can be dynamically controlled in-circuit and traded-off with its frequency range, to better suit the circuit needs. This FD needs to be combined (or switched) with a fast PD in order to accomplish a complete PFD function of both frequency acquisition and phase comparison.

When two square-wave signals are applied to the FD depicted in FIG. 7, the resulting waveform at the output 211 will be a train of pulses consisting mainly of three spectral components: the difference of the two frequencies, twice that difference, and a DC component that is basically defined by the duty cycle of this waveform. After passing through an external low-pass filter 210, only the DC component remains, which is proportional to the frequency difference .DELTA.F between the two inputs F.sub.in (201) and F.sub.ref (200). The transfer function of the FD, expressed in [Volt/Hertz], is linear and is defined here to range between (F.sub.ref−F.sub.max) to (F.sub.ref+F.sub.max). Beyond those limits the slope changes its sign, and 2.multidot.F.sub.max past those limits it changes again, and so on, producing a periodic triangular transfer function with a period of [4.multidot.F.sub.max].

Figure 12:
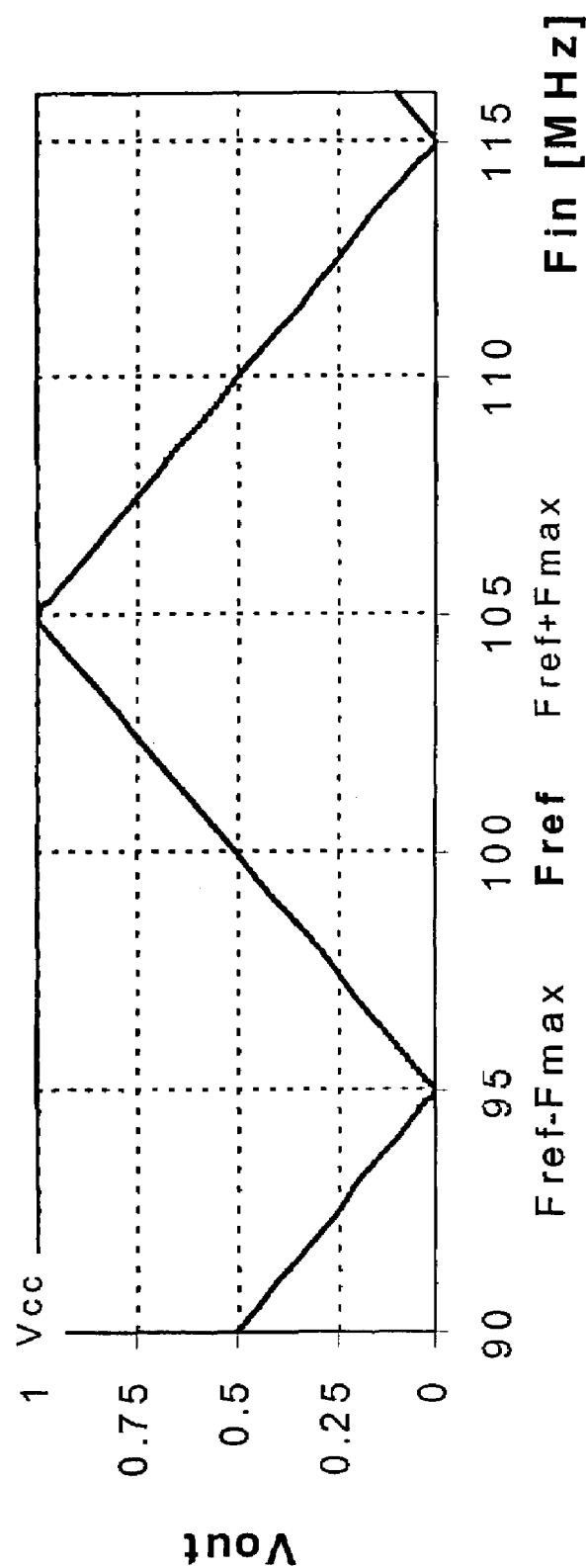
FIG. 12 depicts the transfer function of the FD of FIG. 11, with an example of Fref=100 MHz, and an operating range of .+−.5 MHz around it.

FIG. 12 shows an example of an ideal transfer function of an FD designed to operate in the range of 95 MHz to 105 MHz: F.sub.ref=100 MHz, and F.sub.in=5 MHz. When the input .DELTA.F is positive, Vout 211 is proportionally greater than ½ Vcc, and when .DELTA.F is negative, Vout 211 drops below ½ Vcc. Half Vcc is thus the midpoint of the FD output transfer function. This FD circuit however, suffers from two minor problems. The first problem is that the output, in addition to the desired DC content, includes a component of the "beat" frequency ($F_{ref}-F_{in}$), as well as a component of twice the "beat" frequency:

$2 \cdot (F_{ref} \cdot F_{in})$. This might slightly expect the transfer function's linearity. The second problem is that around the region of frequency equality there is some instability that can be explained by the fact that when the two frequencies $F_{ref}$ and $F_{in}$ are equal the output AC components (i.e., the "beat" and twice the "beat" frequency) will both be 0 Hz so the output will get stuck to either one of the logic states '0' or '1', and thus not resulting in the ideal ½ Vcc will not be achieved.

Figure 8:
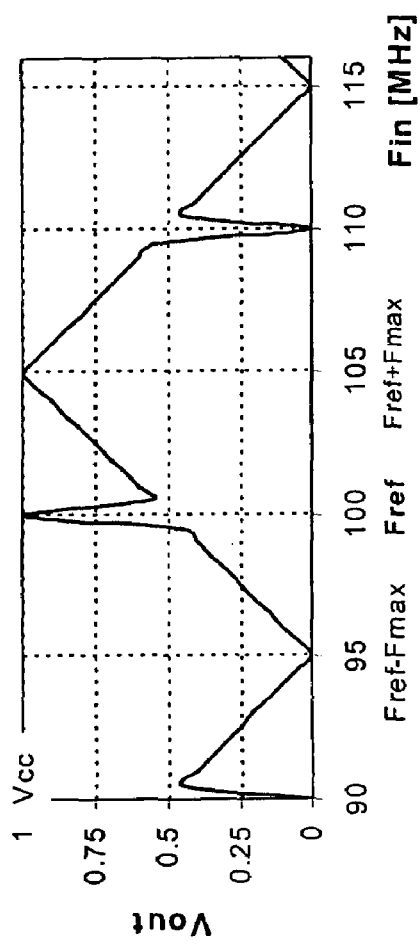
FIG. 8 depicts the transfer function of the FD embodiment of FIG. 7, with an example of F.sub.ref=100 MHz, and an operating range of .+−.5 MHz around it.

This transfer function artifact is shown in FIG. 8. The solution to both problems lies in an improved variation of the FD which is herein discussed as yet another embodiment of the present invention, exhibiting a thoroughly continuous and linear transfer function as shown in FIG. 12. This circuit depicted in FIG. 11, also using complex single side-band conversion to zero IF, processes the input signals 212 and 213 in the same fashion through an LSB block 215 as in the earlier FD shown in FIG. 7. The difference is that here it is split in two sections at the output of the LSB block 215. The top section consisting of delay 216 and XOR 218 is identical to the previous FD. The bottom section consisting of delay 217 and inverting-XOR 219 has the delay 217 off the Q output rather than off the 'I' output of 215, and also the gate 219 is an inverting-XOR. Those two section outputs 223 and 224 get externally summed together prior to the final low-pass filter 221. These incremental modifications achieve the following two things: first the "twice beat frequency" component of $2 \cdot (F_{ref} \cdot F_{in})$ gets effectively cancelled for overall improved linearity of the transfer function as shown in FIG. 12. Secondly, it solves the other problem described for the earlier FD, that when the two input frequencies $F_{ref}$ and $F_{in}$ are equal the output gets stuck at either one of the logic states '0' or '1'. With this new topology when the "beat" frequency is zero, output 223 will get stuck at whatever logic state '0' or '1', while the other output 224 is guaranteed to get stuck to its complementary logic state. Therefore, after the signal summation at 220, the DC content will always be correct at ½ Vcc.

Figure 11:
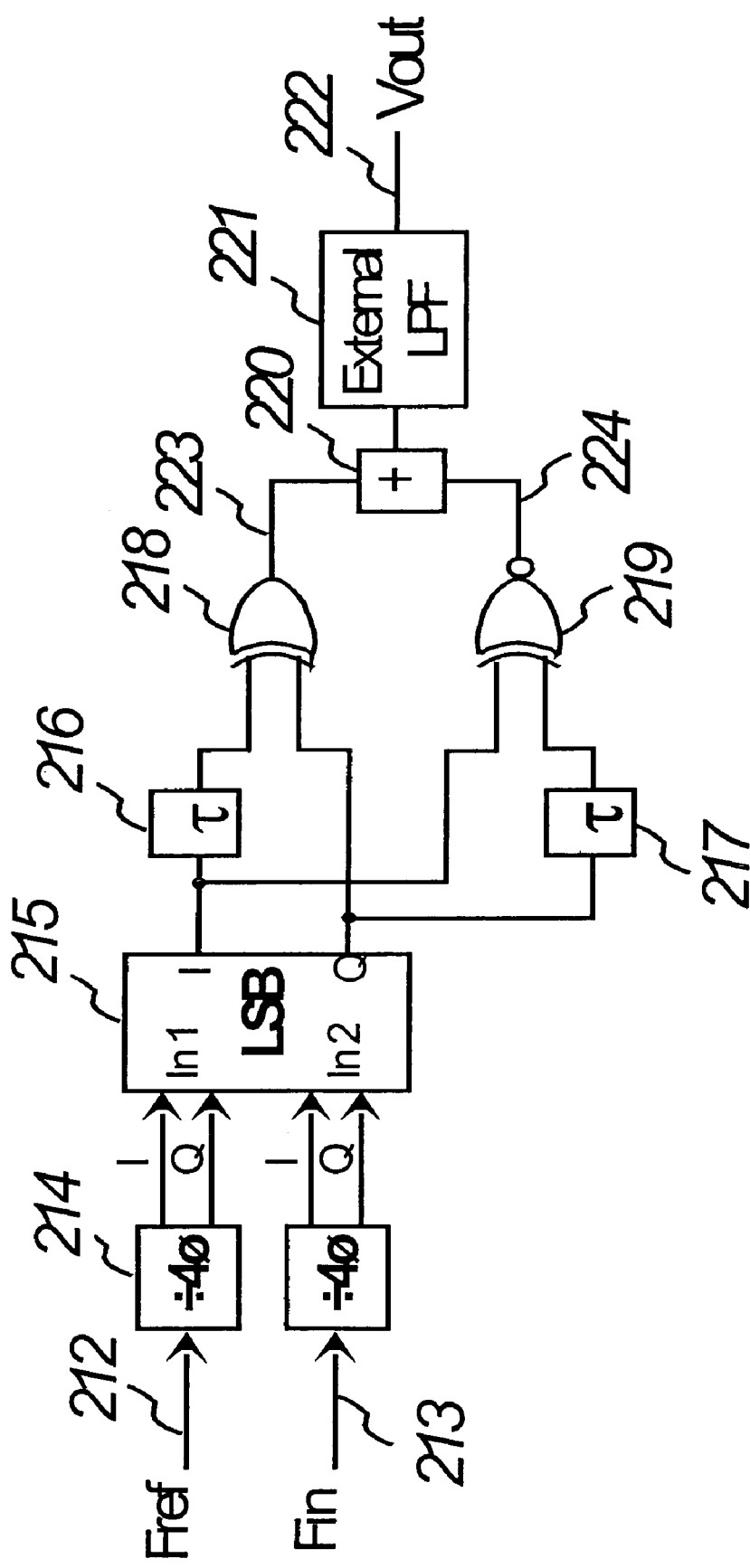
FIG. 11 depicts the block diagram of the second embodiment of a bi-level Frequency Discriminator (FD).

The following explanation will first describe the simple circuit of FIG. 7, because the more complete circuit of FIG. 11 is one including the complementary summation of two sections similar to FIG. 7. The operation of the bi-level FD is based on complex single side-band mixing of two input signals to extract the difference in frequency between them while suppressing their sum (lower side band only, or LSB). This LSB process is done in block 204 having two outputs in quadrature phasing, I (205) and $\overline{Q}$ (206). Subsequently, output 205 only gets delayed with respect to its quadrature counterpart 206 by a fixed time $\tau$ (implemented in 207), and finally get mixed together by an exclusive-OR (XOR) element 208. To better understand the operation of such circuit let's take an example where two square waves of frequencies Fref and Fin are input at 200 and 201, and each get divided by four by blocks 202 and 203, producing ¼Fref and ¼Fin. Let's presume that the LSB block 204 generates two outputs 205 and 206 consisting of two equal square waves with quadrature phase relationship (90.degree. phase shifted from each other) having a frequency of exactly the difference between what is presented at the LSB inputs. Let's refer here to this frequency difference generated by 204 as "¼.DELTA.F". For the purpose of this explanation let's assume for a moment that the delay 207 is set to zero ($\tau=0$). In this case, the multiplying element, a simple XOR gate 208, would output a waveform at twice that frequency ($2 \cdot ¼ \Delta F = ½ \Delta F$) with 50% duty cycle. With this duty cycle the DC content of that waveform would be exactly ½ Vcc (Vcc being the upper rail voltage of the XOR gate 208). Because $\tau=0$, even if the input frequency changes, the quadrature phase relationship at 205 and 206 is always maintained and the output 209 would always be at 50% duty cycle no matter what the input frequency is. When the delay 207 is a fixed time other than zero: $\tau \neq 0$, then the phase difference PHI. of the signals at the input to the XOR 208 would be the given quadrature (90.degree.) plus some other phase shift that is linearly proportional to the input frequency difference ¼.DELTA.F:

$$\Phi = 90° + \tau \neq ¼ \Delta F \cdot 360° = 90° + \tau \cdot \Delta F \cdot 90° \quad (42)$$

It is common knowledge that the DC output of any XOR gate whose inputs are square waves of the same frequency, and phase shifted with respect to each other by .alpha. degrees is:

$$V_{XOR} = Vcc \cdot \alpha / 180° \quad @ 0° \leq \alpha \leq 180°$$

$$V_{XOR} = Vcc \cdot (360° - \alpha)/180° \quad @ 180° < \alpha < 360° \quad (43)$$

Since this function is periodic over 360.degree., .alpha. needs to be defined here as being modulus 360.degree. Hence, thie eq. (43) basically describes a triangular function.

When replacing PHI. of eq. (42) with .alpha. of eq. (43) we get the FD output DC voltage 211:

$$Vout = Vcc \cdot (90° + \tau \cdot \Delta F \cdot 90°)/180° = ½ Vcc \cdot (1 + \tau \cdot \Delta F) \quad @ -1 < \tau \cdot \Delta F \leq 1 \quad (44a)$$

$$Vout = Vcc \cdot (360° - 90° - \tau \cdot \Delta F \cdot 90°)/180° = ½ Vcc \cdot (3 - \tau \cdot \Delta F) \quad @ 1 < \tau \cdot \Delta F \leq 3 \quad (44b)$$

and periodic thereafter, with a period being [$4 \cdot \tau \cdot \Delta F$], since this quantity corresponds to a 360.degree. phase shift. In summary, within a given operating range, the XOR output 209 would have a duty cycle that changes linearly with .DELTA.F (which is $F_{ref}-F_{in}$), and so the FD DC output 211 would have a voltage that changes accordingly. The frequency range and the gain in Volt/Hz of both bi-level frequency discriminators disclosed here are identical. When .DELTA.F is substituted with [Fmax] defined here as the frequency difference at the inputs yielding the maximum voltage of Vout=Vcc, and [-Fmax] as the .DELTA.F frequency difference that yields the minimum voltage of Vout=0, then from eq. (44a) it can be inferred that Fmax is related to the delay .tau. by the following equation:

$$18 F max = 1 \quad (45)$$

henceforth, asserting the FD linear range of the input frequency $F_{in}$ (201) spanning from -Fmax to +Fmax around a reference frequency $F_{ref}$ (200).

To better see Vout as a function of the input frequency difference .DELTA.F, (44a) may be re-written in the "$y = a \cdot x + b$" form:

$$19 Vout = [½ Vcc]F + ½ Vcc \text{ or also} \quad (46a)$$

$$Vout = [Vcc \; 2 \; Fmax]F + ½ Vcc \quad (46b)$$

G.sub.FD, the gain of the bi-level FD within this operating range, would be the slope 'a' of this transfer function expressed by eq. (46a) and (46b), thus exhibiting the following relationships:

$$G\ FD = Vcc\ 2 \text{ or also} \quad (47a)$$

$$G\ FD = Vcc\ 2\ Fmax \quad (47b)$$

FIG. 12, shows an example of the transfer function where the reference frequency F.sub.ref is 100 MHz and the delay .tau. (207) is 0.2 .mu.s. From eq. (45) it can be computed that the Fmax is 5 MHz. The operating range in this case would be F.sub.ref.+−.Fmax or 95 MHz to 105 MHz. It can be seen that the outputs 211 or 222 would change from 0V to Vcc linearly as the input frequency F.sub.in changes from the bottom to the top of the range spanning over 2 Fmax. Hence, the computed gain in this example would be Vcc/10 MHz=Vcc*10.sup.−7 [V/Hz]. If this gain was not high enough in order to generate error voltages that could overcome possible PLL circuit offsets or that make the PLL converge fast enough on the reference frequency, the FD circuit would need to switch to a higher gain. Let's say that a gain ten times higher was needed, then the delay .tau. (207) could be increased ten fold to be 2 .mu.s. While the range would narrow down to .+−.Fmax=.+−.0.5 MHz following eq. (45), from eq. (47a) we would see that the gain would increase to ½ Vcc.multidot.2.multidot.10.sup.−6, yielding GFD=Vcc*10.sup.−6 [V/Hz].

Figure 13:
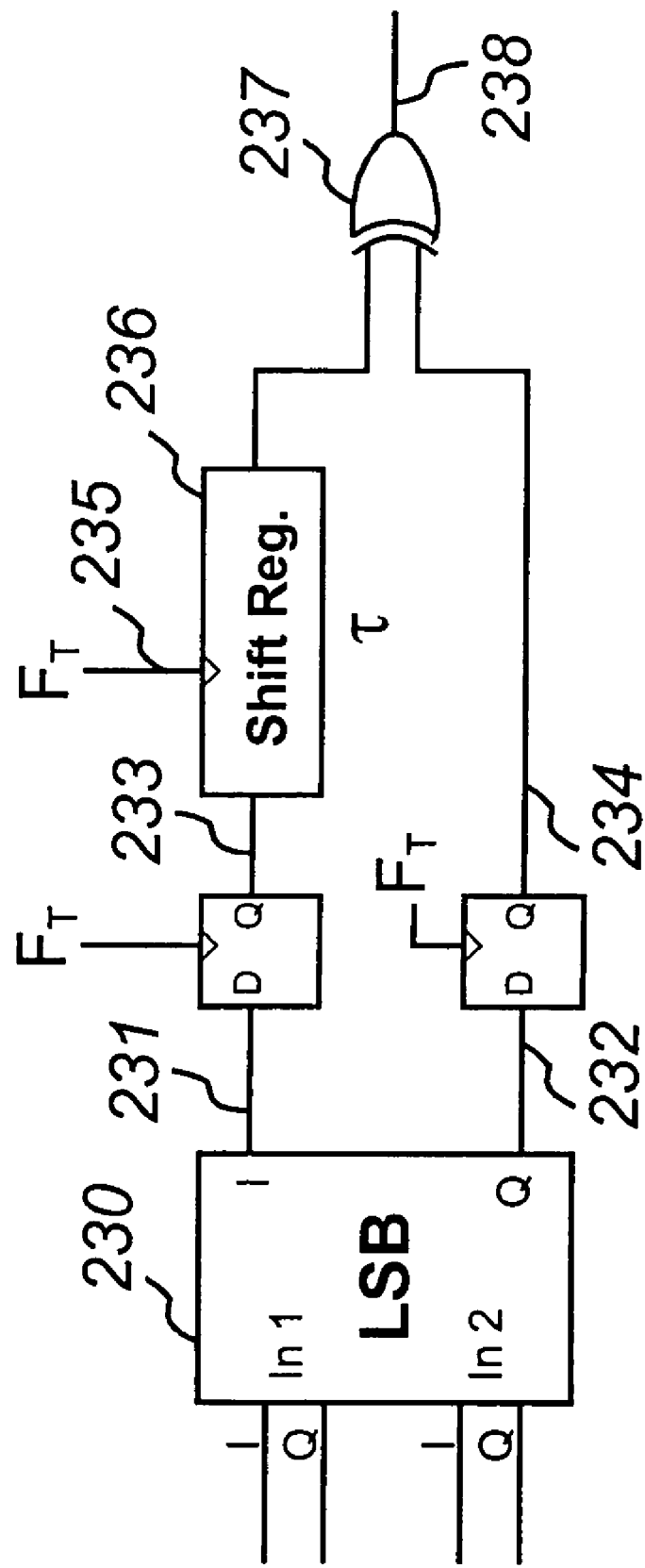
FIG. 13 depicts a delay circuit used in the present invention embodiments of the bi-level FDs, having the capability to be dynamically controlled.

A significant advantage of these FDs is underlined in the above example, being the ability to trade-off range for gain dynamically. When acquiring a signal whose frequency is far away from the desired F.sub.ref the delay .tau. could be dynamically decreased to suit the range needs, and as Fin approaches the target reference frequency then dynamically switch the delay to a longer one suiting the gain needs. A delay circuit implementation allowing its delay period to be dynamically controlled is shown in FIG. 13 and will be discussed later.

Another general feature of the frequency discriminators embodied in this invention is resulting from the periodicity of the XOR function, and thus of the FD transfer function. It can be easily seen from eq. (44a), (44b) and (45) that when the input frequency difference (.DELTA.F) limits are .+−.Fmax the cyclic period of the transfer function is [4Fmax] (also refer to FIG. 12), and thus inversely proportional to the delay. This property could be used in a system where the PLL could be made to lock on a frequency that differs from the reference frequency, as in the case where F.sub.ref is fixed, and it is used to lock a PLL producing F.sub.in=F.sub.ref.+−.k.multidot.[4Fmax], while still maintaining the constraint of the range being .+−.Fmax. For example, if F.sub.ref is a 10.7 MHz clock and .tau. is set to be 4.0 .mu.s yielding Fmax of 250 kHz, the periodicity would be of [4Fmax]=1 MHz. Thus the PLL could lock on any F.sub.in frequency on a 1 MHz grid around the 10.7 MHz reference: e.g. . . . 2.7 MHz, 3.7 MHz, 4.7 MHz . . . 10.7 MHz, 11.7 MHz . . . and so on.

Figure 9:
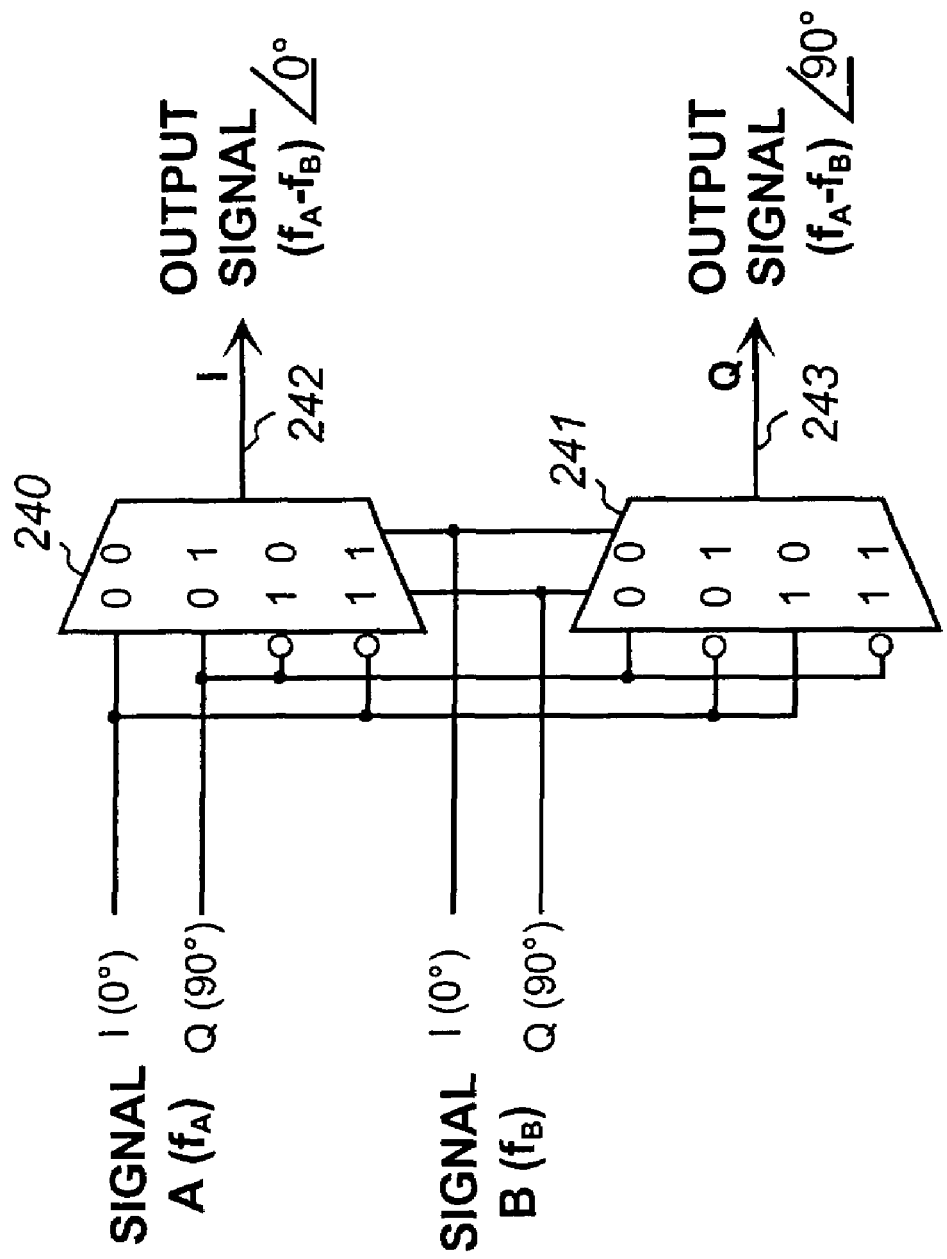
FIG. 9 depicts the Lower Side Band generation block, with complex quadrature outputs I and Q.
Figure 10:
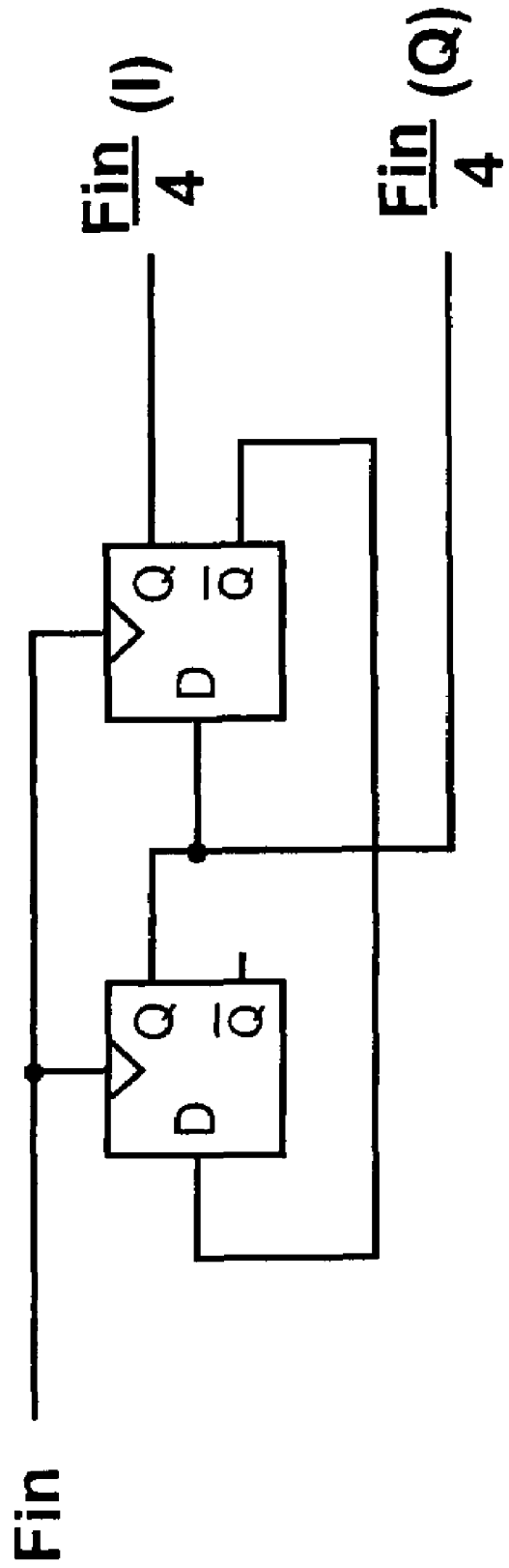
FIG. 10 depicts a prior art synchronous divider by four with quadrature outputs I and Q. This block is also referred in this document as the ".div.4.PHI." block.

The complex LSB block 204 is implemented with two digital multiplexers as shown in FIG. 9, and its description can be found in the commonly assigned U.S. patent application Ser. No. 09/580,513. For optimal operation of the LSB block 204 its input signals need to be square waves having 50% duty cycle, each presented both in-phase (I) and in quadrature (Q). In order to always guarantee such difficult requirement prior to the LSB block it is convenient to divide the input frequencies F.sub.in (200) and F.sub.ref (201) by four by means of what are here called ".div.4.PHI." blocks (202 and 203), which divide by four while providing quadrature outputs I and Q. Moreover, this prior-art ".div.4.PHI." divider shown in FIG. 10 has the advantage of being duty cycle insensitive, meaning that the input signals F.sub.in (200) and F.sub.ref (201) don't need to have 50% duty cycle in order for 202 and 203 to provide accurate square waves. In order to provide a complete FD solution those ".div.4.PHI." blocks 202 and 203 are included as part of this invention's embodiments. The low-pass filters 210 and 221 are shown as part of the block diagrams of FIG. 7 and FIG. 11 even though they are external to the digital circuit. They are used in conjunction to the invention to provide rejection of the unnecessary AC components generated by the FDs, while extracting the necessary DC term. They are included in the block diagrams in order to provide an illustration of a complete FD system, from input to the desired output of DC error signals that would stir a PLL loop VCO. In most applications these LPFs are essentially the loop filters of the PLL and don't demand additional components. In the more robust FD of FIG. 11 both the summer 220 and the LPF 221 are external. The summer could be as simple as a resistive adder: two resistors each connected to the outputs of the XOR gates 218 and 219, connecting together at the other end. In most applications these resistor could essentially be part of the LPF 221. Unlike the prior art FDs, the circuit components used in the FDs disclosed here do not have memory elements like flip-flops in the critical paths, which limit the operation speed due to their inherent slow propagation times from Reset, D and Clock inputs to their output. Here, the signal processing consisting of the LSB 204 and the XOR 208 are combinatorial in nature. In the present art the only speed limiting components are essentially the dividers ".div.4.PHI." blocks 202 and 203. Moreover, these circuit don't suffer from "blind spots" or "dead zones" in the same inherent way that the prior art shown in FIGS. 6A and 6B does. For the purpose of comparison we could say that using a CMOS integrated circuit having typical flip-flop delays of few nano-seconds and gate delays of few hundred pico-seconds this type of FD could easily operate in the 120 MHz range while its Quad-D PFD counterpart would be limited to frequencies below 60 MHz in FD mode and below 30 MHz in the PD mode.

The FD delay elements in the invention could be implemented in various ways. The implementation of choice presented here is using a shift-register 236 clocked It a frequency F.sub.T 235 as seen in FIG. 13. This figure shows a more detailed picture of the delay section of the FD and surrounding components. When a signal is clocked into any register it is effectively sampled at discrete intervals. In order to satisfy the minimum sampling frequency according to the well known Nyquist theorem the clock F.sub.T must be at all times higher than 2.multidot..DELTA.F. Since the maximum .DELTA.F of a properly designed FD as discussed earlier is Fmax then the minimum F.sub.T must be greater than 2.multidot.Fmax. Following eq. (45) it can also be stated that the Nyquist requirement is:

$$F.\text{sub}.T > 2/.\text{tau}. \quad (48)$$

In a shift-register the total delay .tau. depends on the clock F.sub.T and the number of register stages M by the following equation:

$$.\text{tau}.=M/F.\text{sub}.T \quad (49)$$

By substituting (49) into the inequality (48) we get:

$$M > 2 \quad (50)$$

Which becomes our overriding consideration for the selection of an appropriate shift register length M. For design purposes it would be convenient to choose a fixed M and select a clock frequency $F_T$ depending on the range desired:

$$F_T = M \cdot noteq \cdot F\max \quad (51)$$

When the range and the gain of the FD need to be changed dynamically, a simple change of the clock frequency would achieve that. For example, if M=4 and Fmax needs to be narrowed from 10 MHz to 250 kHz, the $F_T$ would need to be switched from 40 MHz to 1 MHz. Another way to control the delay could be keeping the $F_T$ constant, and instead switch in or out a number of taps from the shit register 236. But this type of design usually is more inefficient in terms of hardware gates utilized. FIG. 13, in addition to showing the shift-register 236, it shows two extra registers sampling both the I and Q outputs 231 and 232 of the LSB block 230 at the same clock frequency $F_T$. Those are needed to equalize the initial delay associated with the phase of the sampling clock $F_T$ with the incoming signal. This ensures that the delay as sensed at the inputs of the XOR 237 between the LSB I branch 231 and the Q branch 232 is exactly only the shift-register's delay as calculated by eq. (49), where small propagation delays of the two branches being essentially equal and common-mode cancel each other for the most part, to the point of being utterly insignificant. In addition, at the input of the XOR 237 both inputs are sampled at the same discrete intervals.

A close look of the two bi-level frequency discriminators embodied in this invention reveals that their topology is the same as their analog counterparts described in the opening section of this disclosure and depicted in FIG. 4 and FIG. 3 respectively. To better see this it would be appropriate to liken each analog complex mixer (consisting for example of 70, 75, 76 and 86 of FIG. 3) with a bi-level complex LSB block (204 or 215), and the regular analog mixers (106 and 108) with bi-level XOR gates (208, 218, or 219). The analogy transpires also mathematically likening sinusoidal signals (pure tones) for the analog circuits with bi-level square-wave signals for the digital circuits. Equation (31) shows the mathematical expression for output 128 of FIG. 4; the analogy with the circuit of FIG. 7 can be seen where also in that case the output consists of the DC term and the two spectral components of the "beat" frequency and twice the "beat" frequency. In the case of output 116 of FIG. 3 equation (28) shows that as with the bi-level circuit of FIG. 11 the output consists of the DC term and only one other component being the "beat" frequency of the two input signals. Also analogous is the transfer function of the FD. While in the analog version of FIG. 3 the transfer function is periodic and sinusoidal as seen in FIG. 5, in the bi-level FD of FIG. 11 the transfer function is periodic and triangular in nature as the one seen in FIG. 12, and essentially having the same positive and negative regions.

Figure 6A:
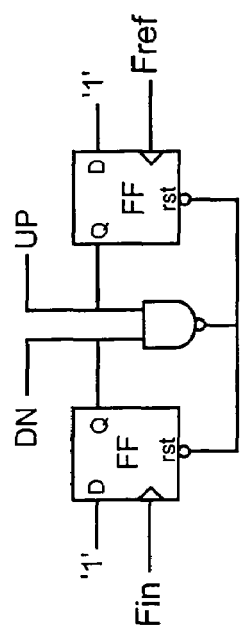
FIG. 6A is a block diagram of a Dual-D Flip-Flop Phase-Frequency Detector (PFD) of the prior art, utilizing two flip-flops in a feedback arrangement.
Figure 6B:
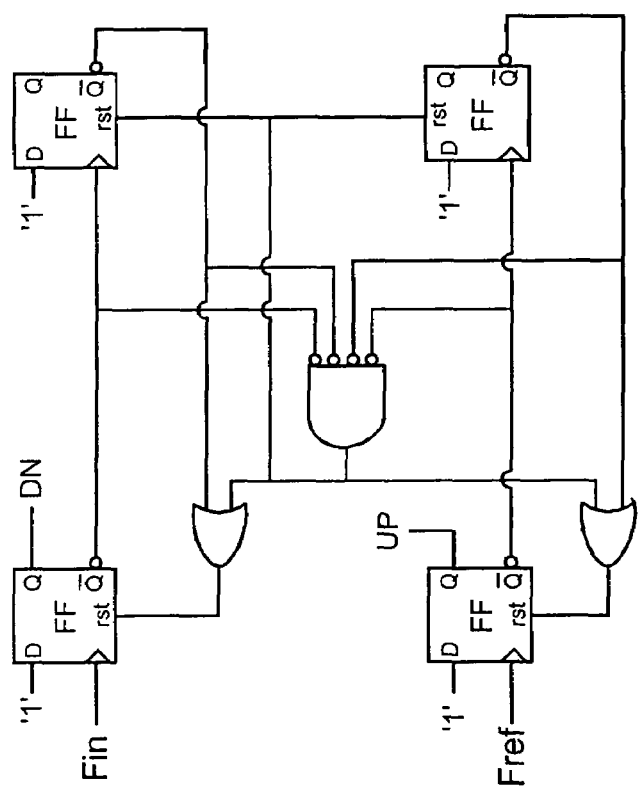
FIG. 6B depicts another prior art PFD, utilizing Quad-D Flip-Flops, as typically implemented in the common industry standard CMOS integrated circuit, such as the widely used CD4046.
Figure 6C:
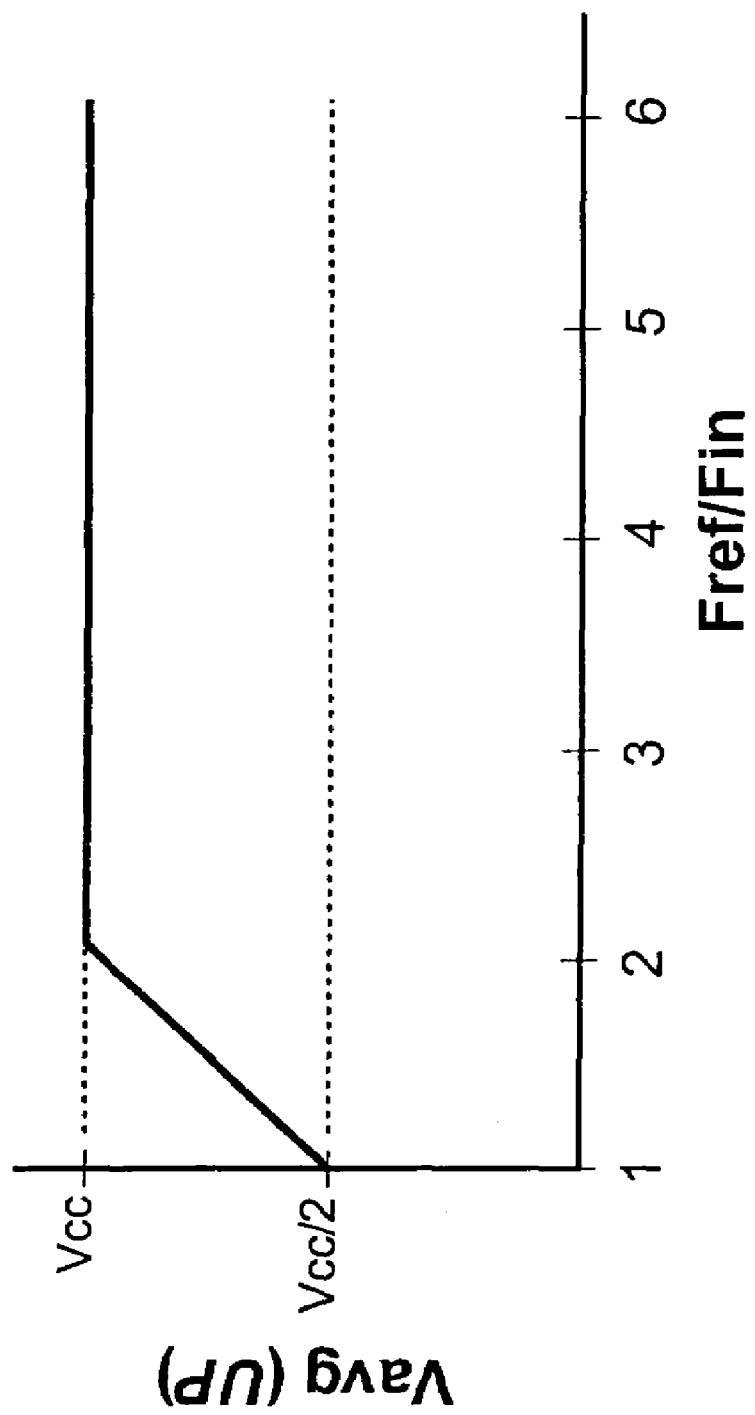
FIG. 6C depicts the transfer function of the frequency discriminator of the prior art of FIG. 6B.
Figure 14:
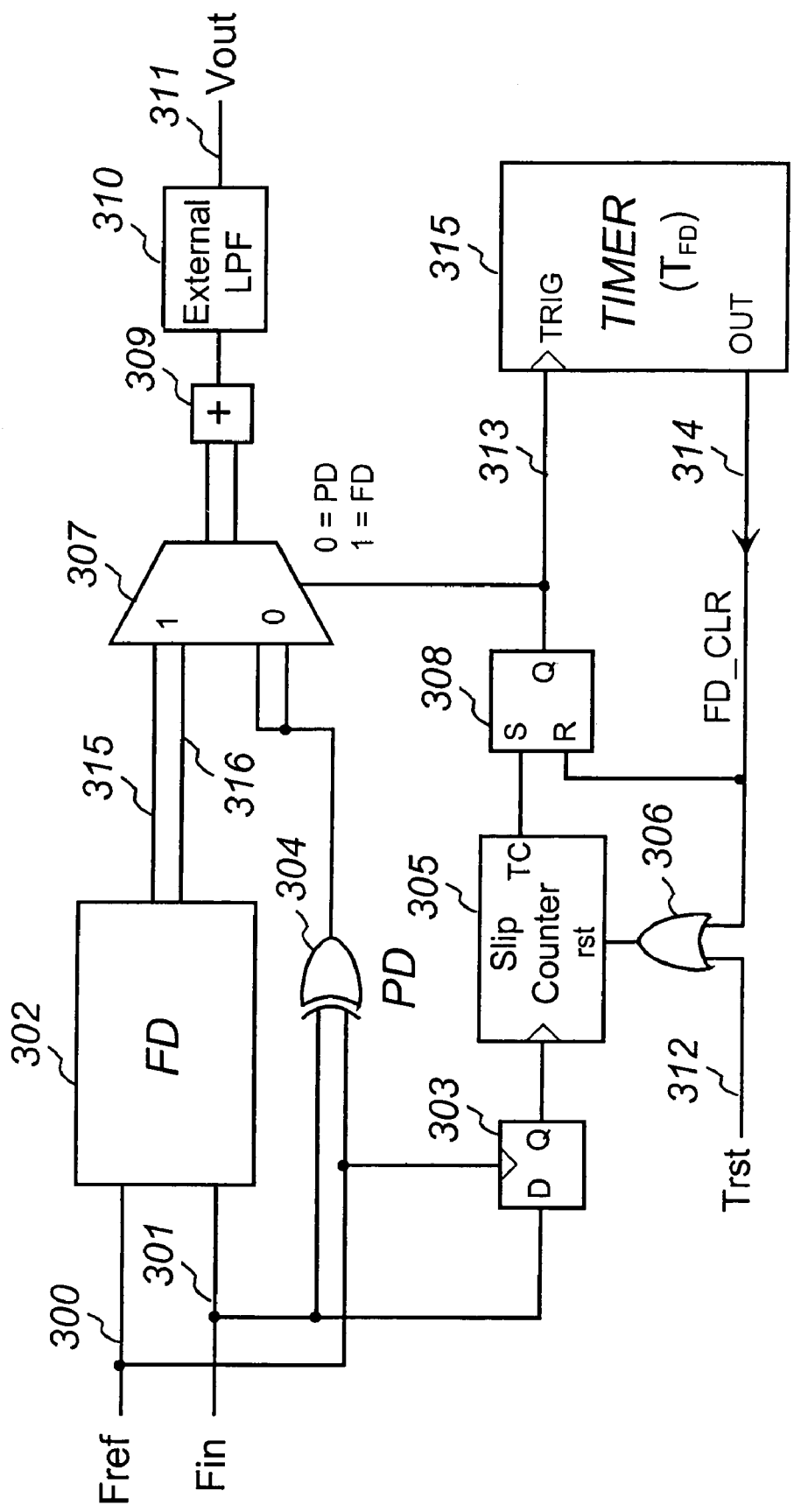
FIG. 14 depicts an apparatus to automatically switch the bi-level frequency discriminator of FIG. 11 with an XOR phase detector when necessary, essentially achieving the combined PFD functionality.

When in a PLL an FD is used to stir the VCO towards the reference frequency the FD alone would never be able to create a phase-lock situation, meaning that it couldn't replace the phase detector function of generating the error voltages necessary to correct and maintain the VCO phase. As explained earlier an FD's DC output component is proportional only to the input frequency differences and not to the phase differences. Hence, a complete PLL solution would only rely on an FD to drive the VCO close enough to the reference frequency, but then would need to transition to a PD to capture and phase-lock the loop VCO. Some prior art circuits as shown in FIGS. 6A and 6B combine both the PD and FD functions in one, and therefore are referred to as PFDs; however, they suffer from the shortcomings outlined in previous discussions. In conjunction with the embodied invention of the bi-level FD an automatic switching was devised that kicks in an FD such as the one shown in FIG. 11 any time the PLL is sensed as not being locked. Subsequently, after a calculated amount of time a simple but efficient XOR PD is switched to transition the PLL from a frequency acquisition state and into a phase-lock state. This new embodiment of the invention is depicted in FIG. 14 showing an apparatus that performs this auto-sensing of phase-lock condition and auto-switching of the FD/PD functions as necessary. In steady-state, when the loop is phase-locked, the PD 304 is engaged through the multiplexer (MUX) 307, which is designed to have two ports each having two inputs: the '0' port connected to the PD and the '1' port connected to the FD outputs 315 and 316). Since the PD element 304 is single ended its output is sourced to both of the inputs of the '0' port of the MUX 307. The two outputs of the MUX are summed by 309, filtered by 310 and ready to drive the loop VCO to maintain phase-lock. In this state Fin (301) and Fref (300) are locked to each other (coherent relationship), and are driven to be 90.degree away from each other to satisfy the DC lock condition which is when the XOR (304) output duty cycle is 50%. The D-FF 303 is constantly clocking Fin with Fref, but since they are both square waves of the same identical frequency it would output a fixed logic state of either '1' or '0'. The Slip Counter 305 is an edge-triggered synchronous divider by K which in this state would never be clocked and thus never reach a "terminal count" (TC) state. Assuming the FD_CLR line 314 being inactive at '0' the slip counter 305 would periodically be reset by signal 312 which is a periodic narrow pulse occurring at intervals Trst. Also, in this steady-state the RS-FF 308 is reset, thus outputting '0' on line 313, which ensures that the MUX 307 is in PD mode and that the timer 315 is not triggered to start. As the loop gets out of lock the $F_{in}$ (301) and $F_{ref}$ (300) start to shift away from each other and eventually the D-FF 303 would start toggling at about the "beat" rate of the input frequencies generating a series of what we'll referred to as "slip pulses". Whenever the rate of these slip pulses exceeds (K−1)/Trst then the slip counter 305 would reach its full scale and before rolling back to zero a terminal count (TC='1') output would occur. This condition would set RS-FF 308 to output a '1' on line 313, which would in turn switch the MUX 307 to FD mode by routing its '1' port inputs 315 and 316 to summer 309. As in FIG. 11 the FD (302) outputs need to be summed and filtered, here shown by blocks 309 and 310, to generate a final output 311 that would stir the loop VCO in the right direction. In a given PLL circuit the maximum time it would take the FD to pull the VCO frequency to within the loop bandwidth is a predictable parameter that in general depends on the FD gain GFD and the overall loop bandwidth. Therefore, in order to lock a PLL it would be enough to let the FD mode on for just that much, then switch back to PD mode and wait for the loop to converge into a phase-lock state. This timing function is accomplished here by the timer 315. Once the RS-FF 308 is set and line 313 changed to '1' (indicating out-of-lock state) besides causing the switching of MUX 307 to FD mode it also would trigger the timer to start a count for a period of TFD. This TFD needs to be greater than the worst-case maximum time required for the frequency lock of the PLL. After this $T_{FD}$ period the timer needs to generate a pulse called here FD_CLR (314) that would extend for another period $T_{FD}$. Henceforth, it would reset the slip counter 305 as well as the RS-FF 308 back to '0', causing the MUX 307 to switch back to PD mode after being in FD mode for T.sub.FD time. This reset would remain forced as long as the FD_CLR 314 is '1': a period T.sub.FD long. The reason this FD_CLR (314) time is kept active so long is to allow the slip counter 305 to remain clear of any counts while the PLL transitions from frequency acquisition to a steady phase-lock, so as to start afresh once the loop has settled. One additional design consideration would be the selection of a proper slip counter length, and its reset clock period Trst. Both those parameters allow a proper setting of the sensitivity of the phase-lock loss setting traded-off with immunity from possible false "alarms". The slip counter 305 basically accumulates the number of slip pulses generated when Fref and Fin (inputs 300 and 301) are different and non-coherent. The rate of these slip pulses generated by 303 is .vertline-.Fref-Fin.vertline.=.DELTA.F. Thus, the condition for the setting of the terminal count of 305 would be:

$$21\ F > (K-1)Trst \tag{52}$$

K being the count length of the slip counter 305 and as mentioned earlier Trst being the period of the reset pulses on 312. The minimum number of register stages L required by the slip counter relate to K by this expression:

$$L = \text{.left brkt-top.LOG.sub.2}(K)\text{.right brkt-top.} \tag{53}$$

For example, if a count of 8 is required, the length of the slip counter should be 3 registers long.

Phase noise reduction (clean-up) of signals utilizing present invention FD is discussed in this section. In order to simplify an analysis of the FD circuit of FIG. 3 when used in conjunction and as a part of other circuitry, it is helpful to think of it as a device having two input ports, the first input being 62, the second input 72 and one output port 116. However, for ease of analysis it will be shown later in conjunction with FIG. 15 that this three-port device can be simplified into a two-port building block 400, as depicted in that figure. In a typical application where the present art FD of FIG. 3 serves the purpose of phase-noise improvements of signal sources, the input signal 62, which can be described as cos [$\omega_c t + \phi(t)$], where $\phi(t)$ represents the signal's angular (phase or and/or frequency) modulation. This input 62 would come from a signal that needs to be cleaned-up, such as a voltage controlled oscillator (VCO) and the other input signal 72, serving as a reference signal would come from a clean reference source, such as a crystal oscillator or in general some type of a local oscillator (LO). This signal can be represented with cos [$\omega_o t + \theta(t)$], but assuming that the phase or frequency modulation of the LO is insignificant, the phase term can be dropped ($\theta(t) \cong 0$; alternatively, the phase $\phi(t)$ can be viewed as measured relative to the phase $\theta(t)$. i.e., the $\theta(t)$ is absorbed within the $\phi(t)$) and the description simplified to cos($\omega_o t$) representing a clean source. Defining the frequency difference at the two input ports $\omega_c - \omega_o$ as the offset or beat frequency $\Delta\omega$, the output 116 of the entire FIG. 3 block could be expressed as:

$$Vout(t) = K_d \sin[\Delta\omega\tau + \phi(t) - \phi(t-\tau)] \tag{54}$$

Notice that eq. (54) is the same as eq. (28) derived earlier, with BB(t) replaced by Vout(t) and with the exception of the addition of constant $K_d$ which is the net device gain, including the contributions from the multiplying elements, summers and all other building elements. Should there be a need, it is possible to obtain a cosine function in eq. (54) instead of the sine, i.e., to obtain the quadrature signal. That can be achieved by swapping lines 104 and 100, i.e., by multiplying the I and Q signals with their own respective delayed versions, rather than cross-multiplying the terms as shown in FIG. 3. Such modified circuit can achieve identical functions as the unmodified, except for the phase conditions, which would be offset by about 90°.

It's worth mentioning that if the LO's phase $\theta(t)$ was not zero, but was rather modulated with its own angular modulation, the output 116 would in that case provide simultaneous demodulation of the sum of the signals, i.e., eq. (54) would include an additional differential term [$\theta(t) - \theta(t-\tau)$] in its argument. Of course, this also means that the two ports can reverse the roles without affecting the function of the circuit, which is consistent with the inherent symmetry of the circuit in respect to inputs 62 and 72. Furthermore, the LO and its feed line 72 can be thought of as an internal part of the FIG. 3 block itself and as such could be absorbed within it, then this contraption could be seen as a two-port device, with an input 62 cos [$\omega_c t + \phi(t)$] and an output 116 Vout(t). This two-port only representation, referred to as block 400 further on in the discussions, comes in very handy for easy analysis of various loops using the present invention FD block of FIG. 3.

As discussed earlier this invention performs FM demodulation when the frequency of the input signal $\omega_c$ is substantially equal to the LO internal frequency $\omega_o$, resulting in zero beat frequency $\Delta\omega \cong 0$ and consequently $\Delta\omega\tau \cong 0$. The two frequencies do not need to be exactly equal or coherent nor have to be even close to each other in order for FM demodulation to occur. In general, with the circuit of FIG. 3 as well as with other circuits of the present invention the demodulation is possible for arbitrary $\omega_c$ and $\omega_o$ frequencies. According to eq. (54), the output Vout(t) will exist and will be responding to the term $\phi(t) - \phi(t-\tau)$, which is the one carrying the modulation information, regardless of the value of $\Delta\omega\tau$, (except perhaps for $\Delta\omega\tau = 90°$ and multiples of it). This means that the present invention FIG. 3 circuit would provide the FM demodulation function for almost any value of $\Delta\omega\tau$, but the gain (sensitivity) as well as the linearity of the demodulator may not be optimum or acceptable in all such conditions, and therefore special cases of the relationship between delay $\tau$ and offset frequencies $\Delta\omega$ expressed with the following equation may be preferred:

$$\tau \cong \frac{n \cdot \pi}{\Delta\omega} \text{ for } n = 0, \pm 1, \pm 2, \pm \ldots \tag{55}$$

Eq. (55) expresses the zeros of the FD output per eq. (54) and represents the points of maximum demodulation sensitivity and linearity. This function was discussed earlier and depicted in the plot in FIG. 5. The periodicity of this function is $2\pi$, while its zeros repeat at intervals of $\pi$. The sign (polarity) of the frequency difference alternates between adjacent zeros. Also, the frequency detection sense (i.e., the slope of the curve in FIG. 5) differs around alternate zeros: for n=0 and even integers, the slope of eq. (54) is positive, while for odd values of n the sense is opposite, i.e., negative.

Substituting $\Delta\omega = 2\pi \cdot \Delta f$ in eq. (55), more convenient expression for frequency calculations is obtained:

$$\tau \cong \frac{n}{2 \cdot \Delta f} = \frac{n}{2 \cdot (fc - fo)} \text{ for } n = 0, \pm 1, \pm 2, \pm \ldots \tag{56}$$

This ability of the present invention of FIG. 3 to FM demodulate a signal of one frequency (fc) against a reference signal of a different frequency (fo), or to perform an "offset frequency demodulation" just by adjusting the time delay τ constitutes a significant value in itself. For example, it the frequency offset between the two signals fc and fo is 100 MHz, all it takes to FM demodulate the signal while keeping this offset is to set τ close to 5 ns (or to multiples of this value). as can be computed from eq. (56). For a different frequency delta, a different delay can be set. The offset demodulation capability and operation in that mode can be utilized concurrently with other modes in most examples of the applications of the present invention discussed below.

For any value of τ defined in eq. (55), the eq. (54) reduces to:

$$V\text{out}(t) \cong K_d \cdot \sin[\phi(t) - \phi(t-\tau)] \tag{57}$$

and when τ is chosen to be small compared with the rate of change of φ(t) fluctuations, i.e., when the phase change within time interval τ is small, essentially when $[(\phi(t)-\phi(t-\tau))] << 1$, then $$V\text{out}(t) \cong K_d \cdot [\phi(t) - \phi(t-\tau)] \tag{58}$$

and utilizing eq. (5) derived earlier:

$$V\text{out}(t) \cong K_d \cdot \tau \cdot \phi'(t) \tag{59}$$

Converting eq. (58) to Laplace domain, similar result as earlier with eq. (7) is obtained, and can be further expressed as:

$$V\text{out}(s) \cong K_d \cdot \tau \cdot s \cdot \Phi(s) \cdot e^{-\tau s/2} \cdot \text{sinc}(\tau s/2) \tag{60a}$$

The Φ(s) represents the phase modulation term and the product s·Φ(s) represents the FM term. The frequency response of the FM demodulated baseband signal Vout(s) follows the sinc(τs/2) function per eq. (60a). The sinc function has a well known response with equidistant zeros and lobes in-between. The zeros are at argument's values equal to integer multiples of π (coinciding with every second zero defined in eq. (55), i.e., for 0 and even values of n in that equation). The first zero occurs at baseband frequency f=1/τ (substituting the Laplace variable s with 2πf. The frequency response is flat for frequencies well below this zero, and falls-off quickly as the baseband frequency approaches the zero.

For τs/2<<1, the exponential and the sinc term can be dropped from eq. (60a) yielding:

$$V\text{out}(s) \cong K_d \cdot \tau \cdot s \cdot \Phi(s) \tag{60b}$$

representing a compact expression of the FD or FM transler function, suitable for closed loop analysis in various application circuits of the present invention. Eq. (60b) is similar to eq. (11) and can also be obtained by converting eq. (59) to Laplace domain. It's possible, as discussed later, that the delay τ itself may be the function of frequency. This case is discussed later in conjunction with RC delay elements. In that case, the delay τ in eq. (60a) and (60b) should be replaced with a function τ(s), resulting in a different frequency response and behavior of the FM/FD transfer function. With RC delay element, the transfer function would have no zeros other than the one in the origin.

Figure 15:
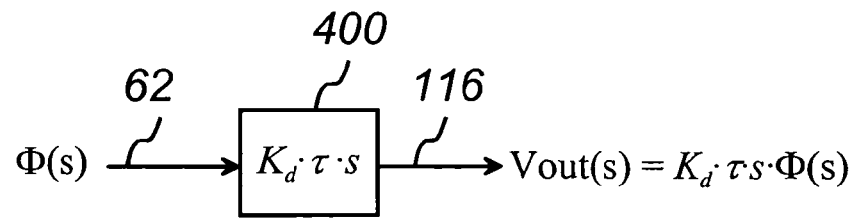
FIG. 15 in a feedback closed-loop configuration with a low-pass filter 413 in the feedback loop to reduce the demodulator internal noise $V_N(S)$ contributions.

FIG. 15 depicts this Laplace representation per eq. (60b) of the FM demodulator/discriminator of the present invention FD, where block 400 encompasses and represents the entire circuit of FIG. 3, and conveniently reduced to two ports only for easier analysis, but without loss of generality per the explanation provided above. Similar two-port Laplace representation can be used with other circuits disclosed in the present invention.

Figure 16:
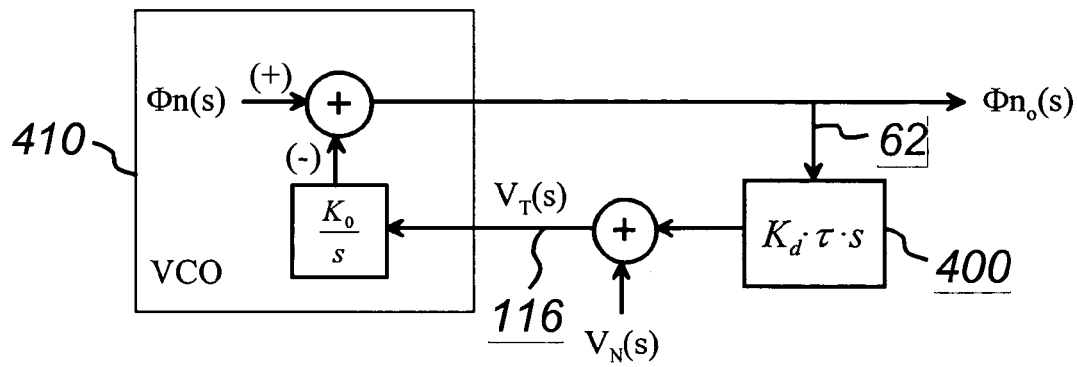
FIGS. 16-19 illustrate clean-up circuits which may be used with a feedback loop configuration.

It is an established fact in the field that FM demodulators could be used in reducing, or cleaning-up the phase noise of CW signals by demodulating the phase noise at the output and then feeding it back in opposite sense to reduce its effect on the output. In this section it will be shown how the present invention could be used to improve the phase noise of signals. The first application brought forth is a circuit for phase noise reduction of a VCO. The Laplace domain equivalent circuit of a VCO source is customarily depicted as a device containing an internal source of phase noise Φn(s), one input control port $V_T(s)$ and an output $\Phi n_o(s)$, as seen in FIG. 16, block 410. The basic operation on the argument of the VCO is that of an integrator $K_o/s$ with a gain of $K_o$, which is usually expressed in $$\frac{\text{radians}}{\text{sec} \cdot \text{Volt}}.$$

Adopting the model of FIG. 15 the VCO clean-up circuit is shown in FIG. 16. The VCO 410 output is fed into the present art FD (FM demodulator) 400, which feeds the VCO control input $V_T(s)$. The noise contribution of the FD itself is modeled as an additive $V_N(s)$, which includes all contributors like the thermal broadband noise of the internal mixers used in 400 and their associated flicker noise.

Since the open loop gain can be expressed as $$K_d \tau \cdot s \cdot \frac{K_o}{s} = K_d K_o \tau$$

the resulting output of that system is:

$$\Phi n_o(s) = \frac{1}{1 + K_d K_o \tau} \cdot \Phi n(s) + \frac{K_o}{1 + K_d K_o \tau} \cdot \frac{V_N(s)}{s} \tag{61}$$

providing an overall phase noise reduction by the loop gain factor of $1+K_o K_d \tau$, seen in the first term of eq. (61), while adding an integrated version of the FD internal noise $V_N(s)$ seen in the second term of eq. (61). The phase-noise reduction is constant at all frequencies, while the second component, due to the integration would be high at low frequencies, but would drop quickly at higher frequencies. The effect of the feedback circuit in FIG. 16 on VCO's FM noise is the same as the effect on its phase noise, as can be found by multiplying both sides of eq. (61) by variable s and substituting the products s·Φ(s) with FM noise terms ω(s). Both phase noise and FM noise will be reduced by the same loop gain factor $1+K_o K_d \tau$. (As will be seen in the case of a frequency lock loop FLL described later, the initial frequency error would be reduced by the same factor). However, the FM noise caused by the internal noise $V_N(s)$ will be constant with frequency, as opposed to the phase noise which has a first order up-slope with decreasing frequency, resulting in higher phase noise closer to DC. In order to reduce the FD effect (mainly its flicker noise) on phase noise at low-frequencies, a high-pass filter (HPF) could be inserted prior to the input $V_T(s)$, as shown as 411 in FIG. 17, which in this example is a simple one pole HPF having the transfer function $$\frac{s}{a+s}.$$

The output would thus become:

$$\Phi n_o(s) = \frac{a+s}{a+(1+K_dK_o\tau)\cdot s}\cdot\Phi n(s)+ \frac{K_o}{a+(1+K_dK_o\tau)\cdot s}\cdot V_N(s) \quad (62)$$

This result shows that the second term that multiplies $V_N(s)$ is essentially low-pass filtered instead of integrated, with a pole at $$\frac{a}{1+K_dK_o\tau}$$

rather than at the origin.

On the other hand the first term which previously reduced the phase noise by the factor $1+K_oK_d\tau$, now won't take affect until the frequency is beyond that same pole.

It's worth mentioning that, like prior art FDs, circuit 400 can work in conjunction with a PLL in the same loop, i.e., it can share the feedback loop and VCO with a PLL to assist in the phase noise clean-up by simply superimposing its signal to PLL's phase detector signal or inserting it into or after the loop amplifier.

The circuit of FIG. 16 can also be used as a frequency-lock-loop (FLL), for frequency locking (but not phase-locking) of a VCO to a reference frequency (which is the signal 72 inside the box 400, but not shown), or to a frequency offset in respect to this reference. The offset frequency can be calculated per eq. (55). Depending on the sense of the loop gain, i.e. The sign of the $K_oK_d$ product, the FLL will be able to lock either only on the even-order zeros of the transfer function, or only on the odd-order zeros. That is because the loop requires negative feedback conditions in order to lock, which is true only for every second zero, while the zeros in-between cause the positive feedback, and will push the loop towards adjacent (negative feedback) zero. The choice of even or odd zeros is controlled by the signal polarities in the design. It's interesting to note that if the polarity of the signal at the output 116 of the present invention FD of FIG. 3 is reversed while the loop is in lock (e.g., by flipping a signal polarity switch), the loop will relock the frequency to an alternate (adjacent) zero point. Reversing the polarity again will cause the loop to force the frequency back to original. This feature could be used for instance to construct an FSK modulator, easily hopping upon command from one frequency to another.

Figure 18:
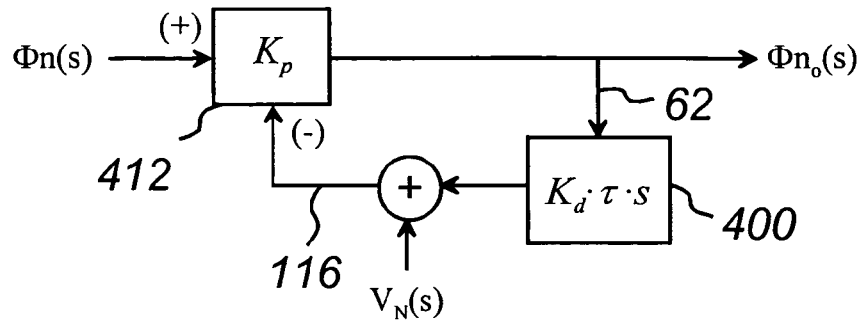

Another valuable phase noise improvement application of the invented FM Demodulator/FD 400 is to clean-up a noisy signal in the case when it's not possible to directly modulate the source of the signal, i.e., when access to the source's modulation port (such as the tuning line of a VCO) is not available. In this case the clean-up can be accomplished by using an external phase modulator (PM) in conjunction with the present invention demodulator 400, embedded either in a feedback loop or a feed-forward circuit. The feedback topology is depicted in FIG. 18. The signal in question has a certain phase noise $\Phi n(s)$; that noisy signal gets modulated by a phase modulator or phase shifter 412 having a gain $$K_p\frac{\text{radians}}{\text{Volt}}.$$

The PM modulator 412 for example can be constructed in a form of a simple tunable RC and/or LC, or transmission line based phase shifters, using varactors as electrically tunable elements. Of course, such a phase shifter needs to operate at the RF frequency of the signal being cleaned-up, and needs to have sufficient tuning speed, i.e., the modulation bandwidth to accommodate the loop requirements. In FIG. 18 scheme, the output $\Phi n_o(s)$ is coupled to the FD 400, which in turn, as explained before adds its own noise $V_N(s)$; the combined feedback from the FD plus its $V_N(s)$ is coupled to the modulator 412. Basically what goes on is that the phase noise present at the port of a noisy signal is demodulated and then re-modulated back in opposite sense in order to reduce it. Mathematically the result is:

$$\Phi n_o(s) = \frac{1}{1+K_dK_p\tau\cdot s}\cdot\Phi n(s)+\frac{K_p}{1+K_dK_p\tau\cdot s}\cdot V_N(s) \quad (63)$$

This shows two low-pass filtering terms multiplying each the input phase noise and the noise contributed by the FD itself. Both noise sources are rejected beyond the cut-off frequency of $$\frac{1}{K_dK_p\tau},$$

however the FD noise contribution is further multiplied by $K_p$ (attenuated if $K_p$ is smaller than 1). If this noise from the FD itself needs to be diminished it could be possible by inserting a low-pass filter 413 following it, as shown in FIG. 19.

The output would thus become:

$$\Phi n_o(s) = \frac{a+s}{a+(1+K_dK_p\tau)\cdot s}\cdot\Phi n(s)+\frac{K_p}{a+(1+K_dK_p\tau)\cdot s}\cdot V_N(s) \quad (64)$$

Figure 17:
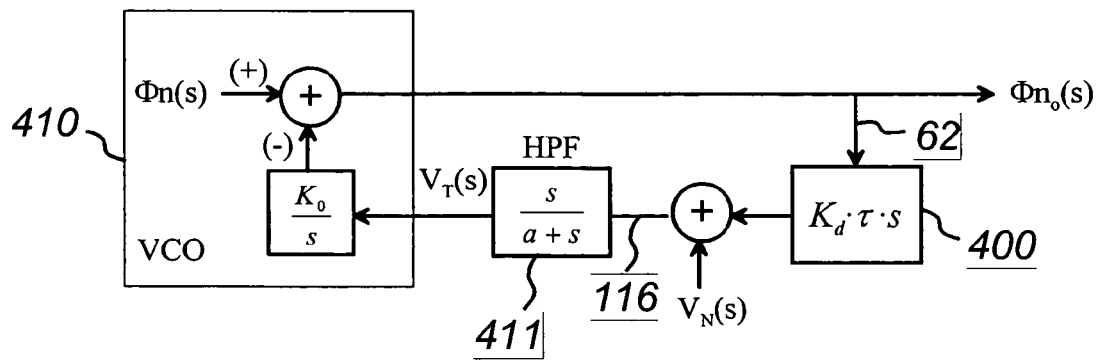
Figure 19:
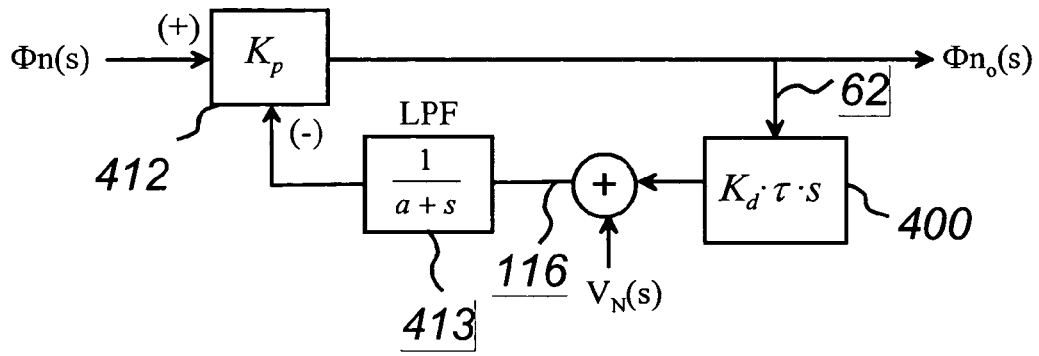
Figure 20:
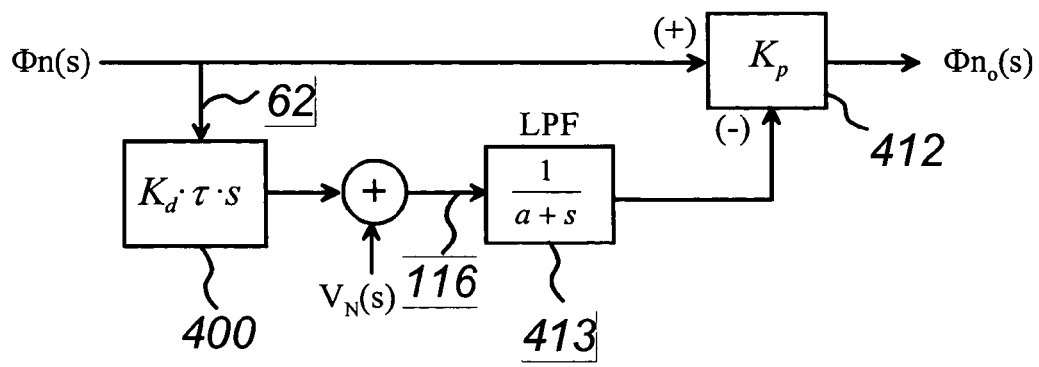
FIG. 20 depicts a phase-noise $\Phi_n(s)$ reduction circuit utilizing a phase-modulator/phase shifter 412 and the FM Demodulator of the present invention 400 of FIG. 15 in a feed-forward configuration with a low-pass filter 413, and showing the demodulator's internal noise source as $V_N(s)$.

This result shows that FIG. 19 circuit behaves much like that of FIG. 17, i.e., the transfer function eq. (64) is identical to eq. (62), provided $K_o$ is replaced with $K_p$. Depending on the choice of the cut-off frequency ($\alpha$) of the low pass filter 413, the circuit of FIG. 19 can behave in a similar way as the VCO circuit of FIG. 16 (if $\alpha$ is small, the filter 413 will act like an integrator, resembling that of the VCO's integrator inside 410), or like the circuit of FIG. 18, if $\alpha$ is large As pointed out earlier the noise clean-up circuits could be also of the feed-forward kind. The basic circuit for a feed-forward circuit using the present invention could be seen in FIG. 20. The phase noise $\Phi n(s)$ on a signal is coupled to the FD/FM Detector 400 having its own internal noise $V_N(s)$. The demodulated phase-noise is subsequently low-pass filtered by the LPF 413. The output of the LPF then modulates the signal through a phase modulator/phase shifter 412 in the opposite sense, so as to reduce the actual noise at the output $\Phi n_o(s)$. Mathematically the result is:

$$\Phi n_o(s) = \left[1 - \frac{s}{a+s}K_dK_p\tau\right]\cdot \Phi n(s) - \frac{K_p}{a+s}\cdot V_N(s) \quad (65)$$

As can be seen this is a useful outcome; the phase-noise drops down reaching a plateau of $1-K_dK_p\tau$ beyond the cut-off frequency $\alpha$; thus, by selecting appropriate $K_p$ and $\tau$ a significant reduction in phase-noise could be achieved. The second term of the equation shows that the noise generated by the FD itself is low-pass filtered, so as not to be a significant factor, especially at frequencies passed the filter corner $\alpha$.

Another possible application of the present art is to help linearize FM modulators requiring high linearity. A common type of FM modulators uses a VCO that is modulated by applying the modulation signal to the tuning line $V_T$. The problem is that the tuning sensitivity, the $K_o$[Hz/V] of the VCO, tends to vary with frequency, and as such it is not constant within the modulation bandwidth. The frequency dependency of $K_o$ directly translates into nonlinear distortion of the modulated waveform. Since the present art demodulator of FIG. 3 can be very linear (choosing optimum delay time $\tau$, which for this purpose would tend to have smaller values, as discussed earlier), it can be embedded in a closed feedback loop along with a modulator, which is a well known techniques in the industry. In this scheme, as shown in [01]

Figure 21:
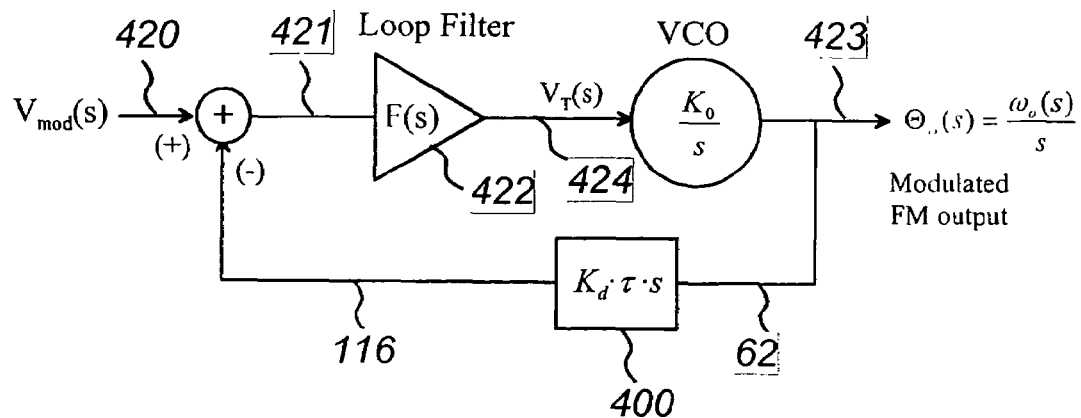
FIG. 21 depicts a high-linearity FM modulator application utilizing a VCO with the present invention 400 providing high linearity FM demodulation function, embedded in a closed feedback loop to improve the modulator's linearity.

FIG. 21, the demodulator of the present art 400 demodulates with high fidelity the modulated signal present at the output 423 of a VCO, which is fed back to input 62 of 400 and its demodulated output 116 is subtracted from the input modulation signal $V_{mod}(s)$ (420) creating an error signal 421. Finally, this error signal is fed via a loop filter/amplifier 422 back to the modulation port 424 of the modulating VCO. It can be shown that the undesired non-linear effect of factor $K_o$ on the instantaneous modulated frequency $\omega_o(s)$ is reduced by the this loop virtually eliminating $K_o$ from the equation, leaving only the dominant linear term $$\omega_o(s) \cong \frac{1}{K_d\cdot \tau}\cdot V_{mod}(s).$$

The reason this term is linear is because the $K_d\cdot\tau$ product is independent of the modulation frequency s. Hence, significant improvements in linearity of FM modulated signals can be achieved. Interestingly, FIG. 21 can also be used for FM demodulation purposes. For instance, if the other input signal of FIG. 3, i.e., signal 72 (which although not shown is inside of box 400) is FM modulated, the VCO in FIG. 21 will track this FM modulation, and the tuning line $V_T(s)$ will provide the FM demodulated baseband signal (of course in this case the $V_{mod}(s)$ must be removed). While block 400 in itself can accomplish FM demodulation, this is an example of a closed loop FM demodulator utilizing the present invention 400 in conjunction with a VCO to accomplish the same function as a classic FM demodulator using a VCO in a standard PLL loop.

The new type of Phase/Frequency Detector (PFD) of the present invention, shown in the block diagram of FIG. 4, is discussed next. For description purposes, this block diagram is redrawn in FIG. 22, by copying the entire PFD block 500 as is, with the only change made in the associated equations in the figure in order to emphasize its phase detection aspects. The equations have been enhanced to include the relevant phase terms, as well as the proportionality constant K. The constant K represents the net gain of the PFD in converting the phase difference of the input signals into an output DC voltage, expressed in units of $$\frac{\text{Volt}}{\text{radian}},$$

including gain and loss contributions of all building blocks inside circuit 500. This constant K has the same meaning as a conventional phase detector $K_{PD}$ gain and as such can be used in PLL design equations in the same manner as $K_{PD}$.

Earlier in the detailed description of the invention the Frequency Discriminator (FD) depicted in FIG. 4 was described in terms of its ability to produce a DC signal, which steers a PLL VCO of frequency $\omega_c$ towards a reference signal of frequency $\omega_o$, thus achieving a frequency-lock. Eq. (31) described the signal at the output of the FD, emphasizing only its frequency properties, while ignoring the phase properties of the signals assuming it would be of no interest during a pure frequency acquisition only. However, in this section it will be shown that once the frequency difference, or beat frequency $\Delta\omega \equiv \omega_c - \omega_o$ approaches zero, i.e., once the frequency has been acquired (FD function accomplished), the same circuit 500 of FIG. 22 would start operating on the phase difference between the two sources resulting in a DC signal that would then drive the VCO phase to become equal to the reference phase, effectively also achieving the function of a Phase Detector (PD).

Figure 22:
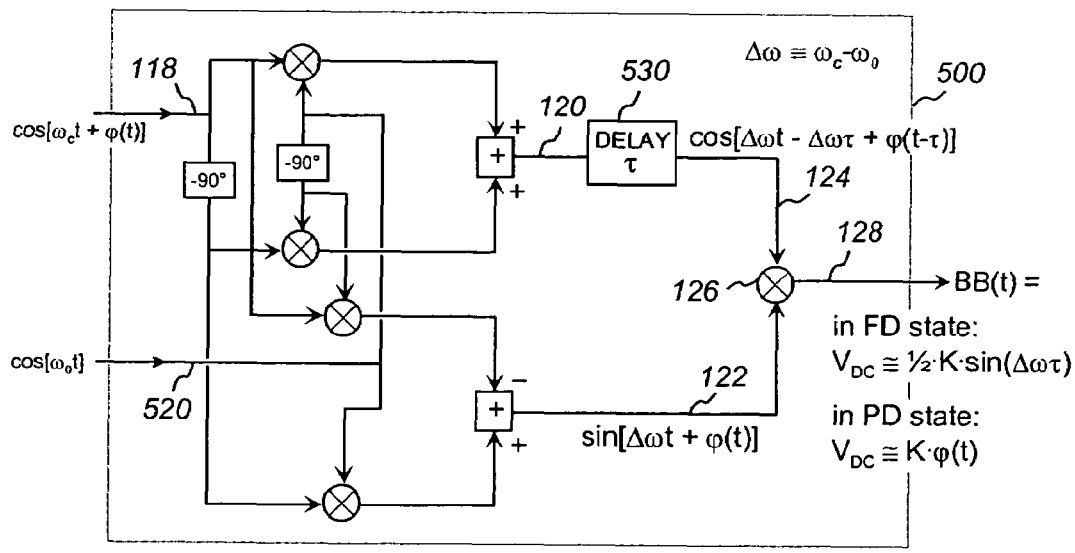
FIG. 22 depicts the embodiment of the present invention new type of low-noise, high-frequency phase-frequency detector (PFD) 500, encompassing the entire circuit of FIG. 4, utilizing complex SSB conversion in both the in-phase and quadrature arms, delaying the in-phase arm by delay time τ in 530, beating the delayed signal 124 with the un-delayed quadrature signal 122 in multiplying element 126 and providing the output 128. The output 128 contains both the information of the frequency difference and the information of the phase difference of the two signals 118 and 520, thus providing both the frequency-discrimination (FD) and the phase detection (PD) functions.

As shown in the FIG. 22 the circuit 500 receives at its inputs two signals 118 and 520 and produces one signal 128 at the output. In a typical application of the PFD 500, such as in a PLL/synthesizer application, the input signal 118, described as $\cos[\omega_c t+\phi(t)]$, would come from a VCO and the other input signal 520, described as $\cos(\omega_o t)$ would come from a reference source. The phase of this reference signal and its phase noise are assumed zero in the following discussions for clarity purposes. The $\phi(t)$ is the instantaneous phase of the VCO and since the reference phase is zero, the $\phi(t)$ also represents the phase difference of the two signals, i.e., the difference between the VCO and reference phase. Substituting the beat frequency $\omega_c-\omega_o$ with $\Delta\omega$, simple trigonometry leads to the expression of the signal at 120 as $\cos[\Delta\omega t+\phi(t)]$ and at 122 as $\sin[\Delta\omega t+\phi(t)]$. After the delay $\tau$ in block 530, the signal at 124 can be expressed as:

$$\cos[\Delta\omega t-\Delta\omega\tau+\phi(t-\tau)] \quad (66)$$

Multiplication of signals 124 and 122 in mixer 126 results in the following output BB(t) at 128:

$$BB(t)=\tfrac{1}{2}\cdot K\cdot \sin[\Delta\omega\tau+\phi(t)-\phi(t-\tau)]+\tfrac{1}{2}\cdot K\cdot \sin[2\cdot\Delta\omega t-\Delta\omega\tau+\phi(t)+\phi(t-\tau)] \quad (67)$$

It can be easily seen that this is the same as eq. (31), with the addition of the phase terms and proportionality constant K. Like eq. 31, the first part of eq. (67) contains a DC term, while the second part is an AC (sine-wave) signal, varying at the rate equal to twice the beat frequency of the two signals. Whenever the PLL is not locked, i.e., when the frequencies of the VCO and the reference signals are not equal ($\Delta\omega\neq 0$), the output 128 of the PFD 500 generates both a DC and an AC voltage. The VCO frequency is controlled (steered) by the DC part of the voltage, i.e., by a DC term of eq. (67), while the AC part of the voltage does not participate in frequency control (the AC voltage averages to zero and as such does not contribute in the frequency acquisition process). The phase term [φ(t)−φ(t−τ)] in the first part of eq. (67) does not play a role in DC generation, since its value is very close to zero, as will be explained shortly. Thus according to eq. (67) and consistent with previous description in conjunction with eq. 31, the DC seen at the BB(t) output 128 that steers the VCO frequency is proportional to ½·sin(Δωτ), and circuit 500 effectively operates as an FD with a transfer function of the same shape as shown in FIG. 5, but with half the gain. Thus, the output 128 of the present invention circuit 500 in the FD state is governed by the following expression:

$$FD\ State:\ BB(t) \cong \tfrac{1}{2} \cdot K \cdot \sin(\Delta\omega\tau) \tag{68}$$

However, as the frequency difference approaches zero and falls into the PLL loop bandwidth the phase starts taking over the control of the DC component, starting the process of phase acquisition, thus effectively transitioning from FD to PD function. The transition from FD to PD is inherent to the circuit 500 of the present invention and is accomplished automatically, in a spontaneous and smooth manner. The ability to operate both in FD and PD states, transitioning naturally from one state to the other presents a fundamental value and powerful property of the present invention circuit 500. This spontaneous transition property becomes evident by inspecting eq. (67) at the limit condition of equalized frequencies, i.e., zero beat frequency Δω=0 achieved upon frequency acquisition when eq. (67) reduces to:

$$BB(t) = \tfrac{1}{2} \cdot K \cdot \sin\ [\phi(t)-\phi(t-\tau)] + \tfrac{1}{2} \cdot K \cdot \sin\ [\phi(t)+\phi(t-\tau)]$$
$$\{@\Delta\omega=0\} \tag{69}$$

Since τ is in general chosen to be substantially smaller than the PLL loop time constant, we can notice that φ(t−τ) is substantially equal to φ(t), thus further reducing eq. (69) to:

$$BB(t) = \tfrac{1}{2} \cdot K \cdot \sin\ [2 \cdot \phi(t)]\{@\Delta\omega=0\} \tag{70}$$

As the PLL loop converges towards steady-state phase lock condition, the DC value of the PD output BB(t) 128 must approach zero or very small value (because it is inversely proportional to the PLL loop gain at DC, which tends to be high), meaning that the phase φ(t) also must become smaller, i.e., φ(t)≅0. Thus, eq. (70) can be simplified by small angle approximation, yielding the expression for the output 128 of the present invention circuit 500 that governs the behavior in the PD state:

$$PD\ State:\ BB(t) = \tfrac{1}{2} \cdot K \cdot [2 \cdot \phi(t)] = K \cdot \phi(t) \tag{71}$$

An alternative way of deriving eq. (71) From eq. (69) can be had by recognizing that in the phase-lock (phase acquisition) process, as the VCO approaches the steady-state condition, its phase φ(t) converges to the phase of the reference signal (i.e., to zero) and consequently both φ(t) and φ(t−τ) converge to zero (φ(t)≅φ(t−τ)≅0). Thus small angle approximation can be directly applied to both sine terms in eq. (69), which after cancellation of φ(t−τ) terms yields eq. (71). In fact, the cancellation of the φ(t−τ) term and consequential elimination of the effects of τ can be viewed as the key reason for the fundamental property of the FD to PD transition of the present invention circuit 500. Vanishing of τ in the PD state means that the output BB(t) is for all practical purposes independent of τ in this state. This further means that in the phase-locked condition for phase tracking purposes the value of τ and the delay characteristics of delay block 530 can be arbitrary (including zero), thus providing more opportunities and freedom in the design and operation of the present invention PFD. Furthermore, since the effect of the delay on the PLL loop characteristics (such as phase margin, gain, stability, etc.) in the locked state is negligible, no new constraints due to present invention PFDs are placed on the PLL design utilizing them.

It's clearer now that BB(t) in this phase-controlling state, being governed by eq. (71), steers the PLL's VCO phase in accordance to the phase difference φ(t), thus accomplishing the phase detector function PD and achieving the desired PLL's complete phase-lock condition. The present invention will ensure that this condition and phase/frequency tracking is maintained and recovered as necessary, upon any phase or frequency disturbances that may occur. While in the locked state, should for instance the phase-lock be lost for any reason resulting in loss of frequency lock, the PFD circuit 500 would automatically start reacquisition by assuming the FD state, then transitioning to PD and ultimately resulting in restoration of the phase-lock condition.

Figure 23:
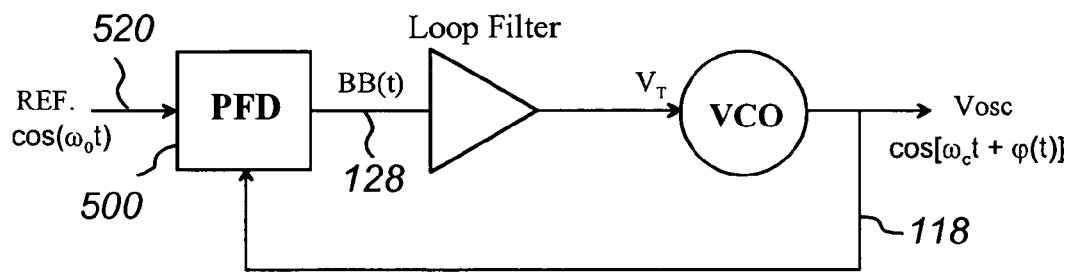
FIG. 23 depicts a typical synthesizer PLL circuit, utilizing the present invention PFD 500, a loop-filter and a VCO. Other versions of the present invention PFDs, such as circuit 550 of FIG. 25 or 560 of FIG. 26 can be used in place of circuit 500 in a PLL synthesizer.
Figure 24:
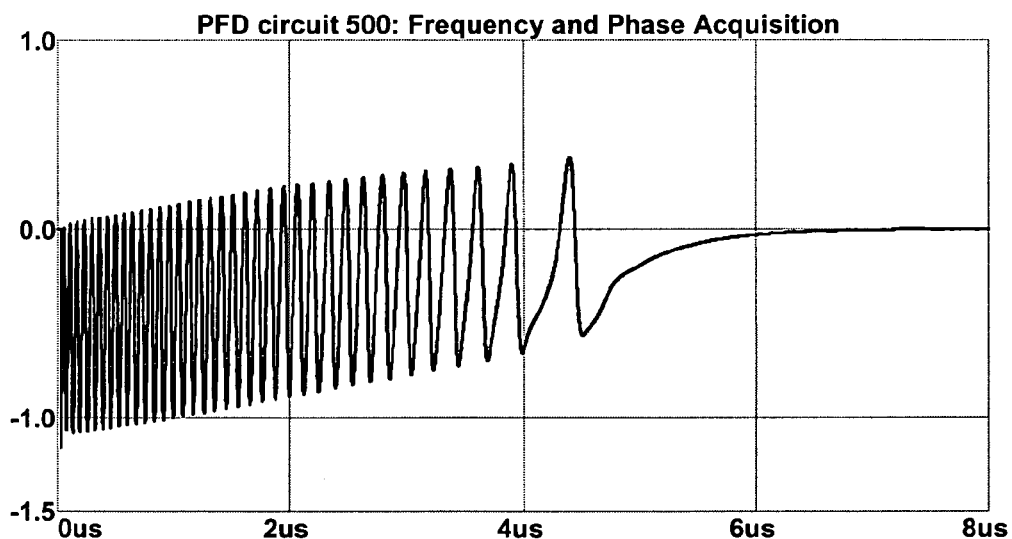
FIG. 24 is a plot illustrating the frequency acquisition and complete phase-lock acquisition of a PLL circuit per FIG. 23 using the new type PFD of the present invention 500 of FIG. 22. This plot is the simulation result with Spice program demonstrating both the FD and the PD function as well as the dynamic behavior of the present invention PFD. The simulation shows an example of a 1.01 GHz VCO being pulled-in and locked to a 1.00 GHz reference signal by the present invention PFD 500 with a delay time τ in 530 of 25 ns, in a PLL with about 1 MHz loop BW. The plot of BB(t) output signal 128 in this figure shows that the frequency acquisition is obtained in about 5 μs, followed with fully settled phase acquisition in another 3 μs, for a total lock time of about 8 μs.

Having the ability to operate both in FD and PD state with a spontaneous and automatic transition from one state to another, lends the present invention circuit 500 of FIG. 22 for an easy use in PLL synthesizer loops, as illustrated in a typical synthesizer PLL loop in FIG. 23. The PLL with the present invention PFD can easily accommodate frequency divider(s), common to many synthesizers at various points in the loop, but for clarity purposes is not shown in this example. Also, most other possible techniques and elements often used with conventional PLLs (such as multiple loops, conversion or offset in the loops, pre-tuning of VCOs with DACs, etc.) can be used equally well with the present invention PFD. The analysis of the loop in FIG. 23 in steady-state can be performed in much the same way as a standard PLL, using the gain factor K as a phase detector gain in the loop equations. The frequency acquisition and phase-lock acquisition of the PLL of FIG. 23 has been simulated with Spice program. Simulation result presented in FIG. 24 demonstrates both FD and PD capability and the dynamics of the present PFD invention when embedded in a PLL loop. The simulation shows an example of a 1.01 GHz VCO being pulled-in and locked to a 1.00 GHz reference signal by the present invention PFD 500 with a delay time τ of 25 ns, in a PLL per FIG. 23 with a loop BW of about 1 MHz. The horizontal axis of FIG. 24 plot is time and the vertical axis is amplitude of the output baseband voltage BB(t) at 128. The plot shows the convergence of the output BB(t) from about −0.7 VDC in this example (when passed through the loop filter) to 0 VDC where the loop is ultimately phase-locked after roughly 8 μs. It is interesting to note that prior to the lock condition, while still in the FD state, the $2^{nd}$ harmonic of the frequency beat component sin(2Δωt) is clearly visible on the plot as anticipated by the second term of eq. (67). In about 5 μs from start this beat tone dies-off, being taken-over by the DC phase component K·φ(t), as the system enters the PD state. In another 3 μs, the phase is fully settled thus completing the entire phase-locking process. It's worth noting that the time delay τ block 530 shown in the in-phase arm 124 in the circuit 500 of FIG. 22, could be relocated to the quadrature arm 122 of circuit 500 without any impact on the circuit operation (except for polarity reversal of some of the signals, which can be easily addressed in the circuit design if needed). Thus, a circuit with the delay in the quadrature arm provides identical functions and can be equally used as circuit 500. Also worth saying is that in some cases inserting filters in both 122 and 124 arms may be beneficial for reduction of out of band noise and spurious signals, if any. Such filters can help reduce noise or spurs; for instance frequency terms occurring due to circuit imbalances causing incomplete cancellation of unwanted sidebands that may be aliased back into baseband by the mixing process in mixer 126. Adding filtering also in the baseband 128 may be beneficial in assisting the loop filter in removal of the unwanted frequency terms.

Design considerations of the delay $\tau$, as evident from eq. (66), reveal that the time delay $\tau$ block 530 in the circuit 500 must be capable of passing the beat frequency $\Delta\omega \equiv \omega_c - \omega_o$. In other words, the bandwidth of the delay circuit 530 must be wide enough to pass the highest beat frequency of interest, which is set by the desired capture range of the FD function of the present invention circuit 500. Consistent with eq. (68), it was previously shown in conjunction with eq. 30 and FIG. 5 that the FD capture range of circuit 500 is a direct function of delay time and is $\frac{1}{2}\tau$, i.e., a range of $\pm\frac{1}{2}\tau$ in respect to the center frequency, implying that the BW of the delay circuit 530 must be at least $\frac{1}{2}\tau$ wide. Luckily, the amplitude response of the delay circuit 530 doesn't need to be flat or constant at all frequencies of interest—it may be acceptable to have the $\Delta\omega$ frequencies attenuated, but only to the extent allowed by the available loop gain. As long as there is sufficient loop gain in FD state to generate enough DC voltage to overcome possible DC offsets and steer the VCO, the attenuation of the delay circuit 530 can be substantial or arbitrarily large and can have arbitrary frequency response. For example, the delay circuit can exhibit attenuation at higher frequencies, such as if implemented as a low pass filter, while the FD can still acquire frequencies above the cut-off of this LPF, provided sufficient gain in the loop. Furthermore, in some realizations of the delay element, the delay time $\tau$ itself may not be constant with the offset frequency $\Delta\omega$, but rather may be a function of it, i.e., $\tau$ becomes a function $\tau\{\Delta\omega\}$. In that case, the zeros of the FD equation (68) may not be equidistant in frequency, but rather would occur at the points where the product $\Delta\omega\cdot\tau\{\Delta\omega\}$ intercepts with $\pi$ or integer multiples of $\pi$, as specified in eq. (54). Depending on the nature of the frequency dependence of $\tau$, it may be possible that there are no zeros of FD eq. (68) at all. One condition when this occurs is $|\Delta\omega\cdot\tau\{\Delta\omega\}|<\pi$, i.e., when the frequency-delay product never reaches the value of $\pi$. One such example occurs in the case of a simple RC delay circuit (series R, parallel C). It is well known that the delay time of this circuit at DC and lower frequencies is equal to the product RC, while above the cut-off frequency of 1/RC, the delay decreases with frequency at $\Delta\omega^2$ rate, in a similar manner as the amplitude response of the same circuit (an LPF response) but at the faster, squared rate. It can be shown that the maximum value of the frequency-delay product $\Delta\omega\cdot\tau\{\Delta\omega\}$ is 0.5 radians (this maximum occurs at the offset frequency $\Delta\omega=1/RC$), i.e., that this product is always less than $\pi$ and therefore zeros of the FD function never occur. Having no zeros to "trap" the FD steering DC voltage, far greater frequency acquisition ranges can be achieved than the range of $\pm\frac{1}{2}\tau$, earlier predicted for frequency-invariant $\tau$. Instead of FD zeros, now the limiting factor in the capture range becomes the loop gain in combination with the attenuation imparted on the signal by the low-pass filtering effect of this type of delay element. In this case in eq. (68) and later in eq. (73) and (76), both the gain factor K and delay $\tau$ are the functions of frequency. The frequency-dependent property of these parameters, i.e., the $K(\omega)$ and $\tau(\omega)$, can be taken advantage of in design optimization of FD gain for optimum acquisition range. The methods of utilizing frequency-dependant delay elements makes the use of present invention PFD more practical in wide range VCO/PLL loops, as shown later in an example. Besides RC delay, some of the possible analog embodiments of the time delay function usable in 530 circuit include well known transmission lines (e.g., micro-strips, coax, thin-film printed strip lines, etc.), all-pass networks, LC low pass filters, etc. It was previously discussed that the delay function 530 can also be realized digitally. For instance, an ADC converting the signal to be delayed to digital, storing the samples for the duration of the desired delay, which can be programmable, then converting back to analog in a DAC can be suitable for an IC implementation.

The choice of an optimum delay $\tau$ for a given FD application requires specific considerations. First, before lock, when the offset frequency $\Delta\omega$ tends to be large, a small $\tau$ would be needed to capture the signal and avoid locking on offset frequencies. Offset frequency locking may occur if the FD is operated around zeros other than in the origin, evident from FIG. 5 or eq. (68). Secondly, once the offset frequency $\Delta\omega$ gets small and approaches zero, more output gain would be preferred to well discriminate the minute DC voltages, proportional to this small and diminishing offset $\Delta\omega$. For such case it would be beneficial to have a larger $\tau$, as can be seen by eq. (68): larger $\Delta\omega\tau$ term means larger Vout(t). The benefits of both a smaller $\tau$ initially and then a larger one as the frequency is steered-in is inherently achieved by the above described RC delay element.

If need be, the delay time and the bandwidth of the delay element 530 can be further extended or controlled by different means, such as switching different delay elements in and out, or tuning the delay time and/or bandwidth by varactor diodes or other tunable elements. This can be done either statically or dynamically, automatically or by means of a control. For instance, different delay elements could be switched in and out in the process of frequency acquisition, and/or the delay time could be gradually increased as locking condition approaches. In such case the gradual changing of $\tau$ could be performed for instance in a closed loop, by utilizing the FD baseband output 128, taking its absolute (non-polarized) DC value by rectifying it, then filtering, amplifying and coupling it back to a voltage-controlled delay line being the delay element $\tau$. In this scenario of a closed loop as the beat frequency decreases in the FD acquisition process, the time delay $\tau$ is caused to increase by tuning the delay circuit in the corresponding direction. The tuning element (e.g., varactor) is tuned in a closed feedback loop by the loop amplifier in the direction of increasing the delay time $\tau$ with the decreasing offset frequency. As the delay $\tau$ increases while the beat frequency $\Delta\omega$ decreases, the product $\Delta\omega\tau$ remains in the first order constant, resulting in constant DC output per eq. (68) If this circuit is embedded as a PFD function inside a PLL circuit, it may help increase the frequency capture range as well as speed-up the frequency acquisition of the PLL. Another interesting possibility may be to split and feed signal 120 simultaneously to a multiplicity of different delay line blocks like 530, each having a different delay time, beat each delayed signal with a split signal 122 in a separate mixer like 126, and sum the outputs of all mixers together to form a composite baseband signal. This way, by controlling delay times of individual lines and weighting their contribution in the summation, more degrees of freedom for controlling the circuit behavior and characteristics such as capture range and loop dynamics is available, but at the expense of higher complexity. This increased complexity may be more affordable in an IC implementation. Similar techniques could also be used in conjunction with the present invention circuit of FIG. 3. For instance, with several delay lines the FM demodulation bandwidth of the present invention can be greatly increased.

The present invention FD circuit of FIG. 3 yields an output per eq. (54) that is equal to twice the first term of eq. (67) as produced by the PFD 500 of FIG. 22. It can be shown that the scheme of FIG. 3 achieves that by actually canceling a term equal (within a factor of two) to the second term of eq. (67), thus operating as a pure FD only. An interesting fact worth noting is that when the same FD circuit of FIG. 3 is slightly modified by changing the sign of the combiner 114, such that it would sum 110 and 112 rather then subtract them (or if need be using an additional summing circuit providing a sum of 110 and 112 at a separate output), then the output 116 would result in yielding twice the second term of eq. (67), while completely canceling the first term of eq. (67), thus operating as a pure PD only. One can therefore switch back and forth between FD and PD operation modes by simply switching the polarity of one of the signals 110 or 112. Utilizing this unique feature, the present invention of FIG. 3 for instance can be used in a PLL to accomplish the full PFD function by first operating in FD mode and subsequently after having acquired the frequency switching to a PD mode. The present invention PFD 500 of FIG. 22 on the other hand accomplishes this automatically, without a need for switching. As emphasized before, it generates both FD and PD terms simultaneously, with spontaneous transition from one to another, thus operating as a complete, self-contained PFD.

The present invention PFD circuit 500 of FIG. 22 has numerous and significant advantages over prior art PFD solutions. First, the present art PFD circuits are inherently much less noisy, achieving extremely low phase-noise and broadband noise, far better than the conventional prior art digital solutions for example of FIG. 6A and FIG. 6B. The present art is also free of the well known "blind spots" problems, common to most prior art PFDs. The "blind spot" is a dead zone occurring with digital flip-flops in a feedback arrangement, where the PD gain is zero, causing phase fluctuations and additional phase noise. It is well known in the art that attaining low PFD noise poses a major challenge in low-noise PLL systems. The noise advantage of the present art PFD can easily exceed 20 dB since its noise is determined predominantly by the performance of the multiplying elements or mixers used in the circuit block 500, the characteristics of which can be controlled and favorably affected to a large extent by design and implementation. The PFD's close-in phase-noise is governed by the close-in flicker noise of the mixers, while the broadband noise of the PFD is governed by the noise figure of the mixers. The PFD's broadband noise translates to the phase noise of the synthesized signal at RF, or in broader sense it can be referred to as carrier to noise ratio or CNR of the signal. Particularly suitable mixers, providing low noise and high signal level capability for use in the present invention, include analog or RF types such as single or double-balanced mixers with diodes or active-switches, Gilbert-cell based mixers, and many more. It is well known in the art that very low noise figures and flicker noise levels are achievable with mixers, including the ones integrated in ICs implementation, resulting in noise floors not far from the thermal noise of −174 dBm/Hz and very low flicker noise corners below 1 kHz. Using mixers with higher compression points capable of handling higher signal levels, and increasing the signal drive levels, it is possible with the present art PFD to achieve a very high CNR (due to PFD noise only) in excess of 180 dBc/Hz at RF. Of course, other noise contributors in a PLL synthesizer system, such as reference noise and loop amplifier noise may lower the attainable system CNR Since there is no internal feedback employed in the PFD circuit 500, unlike with the prior art solutions, there is no inherent upper frequency limitation—the circuit can operate over extremely high frequency and wide range. It's therefore possible to operate the IC implementation of the present art at or close to the transition frequency $f_T$ of the IC process. And, unlike the prior art solutions, the CNR and flicker noise performance of this PFD is substantially independent of the RF operating frequency, i.e. The high level performance can be achieved almost at any frequency within the capability of devices used (e.g., close to transition frequency $f_T$ of ICs or upper operating frequency of discrete mixers, with only slight loss of performance due to roll-off and possibly some other effects). Both of these properties present a significant advantage and provide substantial value in many applications, particularly in high quality signal synthesis.

There is yet another reason for the present PFD low noise advantage—it comes fundamentally from the proportional nature of its operation: when in lock, the demodulated FM noise of the signals being compared is very small, because the demodulated output is proportional to the frequency fluctuation, which in lock is equal to residual FM, and thus is very small. This is unlike the conventional digital PFDs such as the ones of FIG. 6A and FIG. 6B, where the FD gain is not proportional to small instantaneous frequency fluctuations, but is rather a bi-level function having potentially excessive gain in locked condition. That is because the digital PFD of the prior art is unable to track small frequency fluctuations due to its inability to generate very narrow pulses, i.e., it cannot generate pulses shorter than the feedback delay in the reset lines of the registers. When the loop demands pulses shorter than this in order to correct the FM fluctuations, the prior art PFD will be unable to serve them—it will rather deliver excessively longer pulses resulting in disproportionate loop gain, which may overcorrect the error and thus cause higher FM noise in the loop.

The present invention PFD has advantages not only over digital prior art solutions, but also over analog, such as the well known analog mixer phase detector PD. The analog mixer of the prior art does not provide frequency acquisition so other means, such as frequency pre-tuning or frequency sweeping are necessary, making it a much less attractive option. Having this limitation, the analog PD of the prior art would fall in a different category, less valuable in many applications. The present art nonetheless has a noise advantage even over that type of device. The advantage is in the order of 3 dB and it occurs in circuit 500 by taking the advantage of constructive summation of two signals, where both the in-phase and the quadrature arms contribute to the signal level in a coherent way (6 dB), while the noise in these arms, being mutually uncorrelated, causes only 3 dB of noise addition, resulting in net CNR improvement of 3 dB.

The following examples provide the basis for understanding the remarkable CNR performance achievable with the present art PFD 500 using the off-the-shelf mixers in the first example and an IC implementation in the second:

EXAMPLE 1

With passive mixers @ RF frequency of 5 GHz the PFD 500 achieves 180 dBc/Hz CNR at RF: LO level at input 530=20 dBm (translates to 17 dBm LO drive level at I/Q mixers after quadrature split); signal level at input 118=18 dBm, which translates to 15 dBm at I/Q mixers inputs, after 3 dB loss in quadrature splitter; thermal noise=−174 dBm/Hz; Total Loss from input 118 to output 128=12 dB=3 dB (quadrature split loss)+6 dB (I/Q mixers loss) −3 dB (coherent signal addition)+6 dB (mixer 126); CNR=18 dBm+174 dBm/Hz–12 dB=180 dBc/Hz. The noise figure of the passive mixer in this calculation was assumed close to conversion loss, fact well known in the art. It is possible by using mixers with yet higher LO and input signal levels to attain even more impressive PFD performance than the one illustrated in this example.

EXAMPLE 2

In an integrated IC solution @ RF frequency of 2 GHz the PFD 500 achieves 167 dBc/Hz CNR at RF: signal level at input 118=5 dBm; LO level at input line 530=5 dBm; conversion gain from input 118 to output 128=0 dB; noise figure=12 dB; thermal noise=–174 dBm/Hz; CNR=5 dBm+ 174 dBm/Hz–12 dB=167 dBc/Hz. In comparison, today's best conventional digital PFD IC (having a state of the art noise floor of –218 dBc/Hz, which is defined as the phase-noise floor extrapolated to 1 Hz RF frequency), would achieve a CNR performance of no better than 125 dBc/Hz at RF of 2 GHz, highlighting the impressive 40 dB advantage that the present art PFD has. The level of the present PFD IC performance illustrated in the above example 2 by no means presents an upper limit. Even today (mid 2005) with some more advanced IC processes and more aggressive signal drives it may be possible to exceed the performance shown in this example, and certainly as the IC technology advances and the signal power compression point and noise figure performance of mixers and amplifiers improve, so will the PFD performance.

Figure 25:
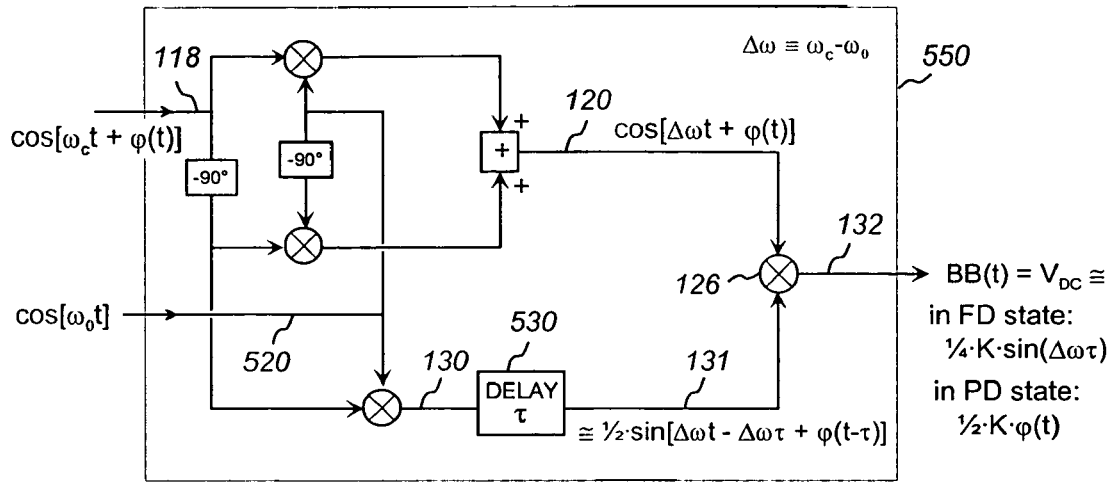
FIG. 25 depicts a simplified novel PFD circuit 550, utilizing only four mixers, rather than the five used in the circuit 500 depicted in FIG. 22. The reduced complexity comes at a price of lower output DC signal levels for the FD and also for the PD function by a factor of two.
Figure 26:
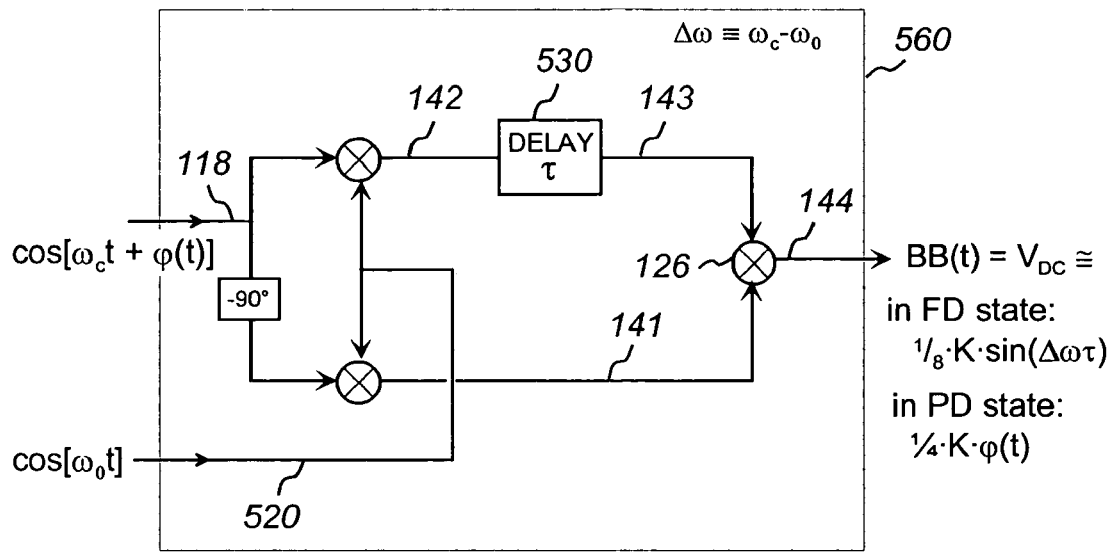
FIG. 26 depicts a further simplified novel PFD circuit 560, utilizing only three mixers, rather than the five used in the circuit 500 depicted in FIG. 22, or the four used in the circuit 550 depicted in FIG. 25. The reduced complexity comes at a price of lower output DC signal levels for the FD and also for the PD function by a factor of four relative to the circuit 500 and a factor of two relative to the circuit 550.

There are variations or derivatives of the present PFD invention having simpler embodiments, utilizing less hardware than the one depicted in FIG. 22. Two of those are shown in FIG. 25 and FIG. 26. They achieve the same FD and PD functionality as 500 with fewer number of mixers, combiners and/or 90° quadrature splitters, but at the expense of CNR; the first variation does away with one mixer and one combiner. This contraption 550 produces the same SSB signal in branch 120 as the one in 500, i.e. The lower sideband beat signal cos [Δωt+φ(t)]. The delay element 530 for exemplary purposes is shown in the branch opposite to this one, i.e., in 130, where the signal is double side-band (DSB). It has a lower sideband component similar to the one produced by 500 on arm 122, and an upper sideband component having a frequency equal to the sum of the reference signal and the LO signal frequencies, both terms multiplied by ½ as can be seen in the following mathematical equation:

$$\frac{1}{2} \cdot \sin[\Delta\omega t + \varphi(t)] + \frac{1}{2} \cdot \sin[(\omega_c + \omega_o)t + \varphi(t)] \qquad (72)$$

This signal is then multiplied by mixer 126 with signal cos [Δωt+φ(t)] 120 (as seen on FIG. 25) and results in a baseband BB(t) output 132. In the mixing process, the left-hand term of eq. (72) produces a DC signal of interest for the FD function, as well as the low frequency beat signal of interest for the PD function, while the right-hand side term produces only high frequency products, which get subsequently low-pass filtered by the loop, leading to the following expressions of the baseband output signal 132:

$$BB(t) \cong \frac{1}{4} \cdot K \cdot \sin(\Delta\omega\tau) \text{ in } FD \text{ state} \qquad (73)$$

and:

$$BB(t) \cong \frac{1}{2} \cdot K \cdot \phi(t) \text{ in } PD \text{ state} \qquad (74)$$

Because these results are similar to the ones of circuit 500 as expressed by eq. (68) and (71), with the exception of being of half the magnitude, we can see that the circuit performs the same PFD function as 500. While the output voltage is lower by a factor of 2 (i.e., 6 dB per the 20·log voltage rule), it can be shown that the noise is also lower, but by 3 dB only (based on the 10·log power rule), resulting in the net 3 dB lower CNR, i.e. The change of the output CNR occurs at the rate of 10·log of the output voltage.

The second variation further simplifies the construction of the present invention PFD. It uses only two mixers and one 90° splitter, a delay element and another mixer. This contraption 560 depicted in FIG. 26 first produces two DSB signals 142 and, one of them (e.g., 142) delayed by τ and the other one (141) un-delayed at 143. The un-delayed signal 141 has identical expression as in eq. (72), while the delayed one at 143 has the same formula, but with t is replaced by t–τ. Then, these DSB signals get multiplied together in mixer 126 to produce a baseband result BB(t) at 144. Including only the lower frequency terms, this signal at the output of circuit 560 can be expressed as:

$$BB(t) \cong \frac{1}{8}\{2 \cdot \cos(\omega_0\tau) \cdot \sin(\omega_0\tau + \Delta\omega\tau) + \sin(\Delta\omega t - \Delta\omega\tau + 2 \cdot \phi(t)]\} \qquad (75)$$

The first portion represents a DC term having FD capability, while the second one is an AC term, turning into a PD phase term as the beat frequency Δω approaches zero. While the DC term in the above equation produces a desired frequency steering signal, it also has undesired zeros, unrelated to the beat frequency Δω. These undesired zeros can slow-down or even stop the frequency acquisition process, by "trapping" the steering DC voltage and forcing it to zero. Per eq. (75), these zeros occur when the cosine argument equals to π/2 or its integer multiples, and/or when the sine arguments equals to 0 or π or its integer multiples. By filtering the upper sideband from signal 142 (or 143) and/or from signal 141, the baseband signal 144 at the output of circuit 560 becomes free of undesired zeros, and takes the same form as in the previous embodiments of the present invention PFD, as expressed by:

$$BB(t) \cong \frac{1}{8} \cdot K \cdot \sin(\Delta\omega\tau) \text{ in } FD \text{ state} \qquad (76)$$

and:

$$BB(t) \cong \frac{1}{4} \cdot K \cdot \phi(t) \text{ in } PD \text{ state} \qquad (77)$$

Per these equations, the output of 560 is similar to that of circuit 500, providing the same FD and PD functions, except at the lower signal level, which is reduced by a factor of 4. Any higher frequency components that may exist at 144 will be subsequently filtered out in a practical PLL by the loop filter. If desired, a filter rejecting high frequencies can be inserted in 144 output line.

This present art PFD circuit 560 of FIG. 26 could be very useful especially due to its simplicity. Despite a lower CNR by 10·log 4=6 dB compared to the present invention 500 of FIG. 22, it is still orders of magnitude better than the prior art digital solutions. A practical example of a full PLL synthesizer system utilizing this simple form of the present invention PFD, where the delay element is realized with a simple RC delay circuit is illustrated in FIG. 27. The VCO has a tuning sensitivity Ko of 100 MHz/V and tunes over an octave, from below 1 GHz to above 2 GHz. The reference frequency is at 1 GHz. An active second order type loop filter provides a loop bandwidth of about 1 MHz. The VCO quadrature splitter, centered around 1.6 GHz in this example is built as a first order RC lead-lag circuit, rather than a higher order and more complex poly-phase filter commonly used in ICs for this function. The lead-lag circuit, while having a good phase matching is not widely used in the industry because of its poor amplitude match between the in-phase and quadrature arms. The two arms are matched in level only at one (center) frequency, while at other frequencies the in-phase and quadrature levels depart from each other, the mismatch increasing with the frequency offset from the center. However, the PFD circuit of FIG. 27 (as well as other PFD circuits disclosed in the present invention) has inherently lower sensitivity in regard to the amplitude mismatch in the two arms, and as such can take advantage of the lower complexity lead-lag circuit. Reduced signal mismatch sensitivity in the present invention is due to the multiplication of the two signals by each other—while one signals is higher, the other is lower, keeping the product constant thus providing first-order correction of the level mismatch effects. The multiplication effectively occurs in the output mixer 126 via multiplication of signals 143 and 141 which are the down-converted versions of the mismatched signals. Of course, any amount of signal limiting that may occur in the mixers in FIG. 27 may further reduce the effects of the mismatch. Regarding the frequency acquisition, since the delay time is not constant with frequency, for the reasons discussed earlier the frequency acquisition range is far greater than what the RC time constant would suggest. In this example, the RC time constant of 1.8 ns is chosen. According to earlier derived formula $\pm 1/(2\cdot\tau)$, this time constant would imply a capture range of less than $1/(2\cdot 1.8\text{ ns})=\pm 272$ MHz. However, based on Spice simulations, the acquisition range of the PLL example using the present art PFD of FIG. 27 is several times larger, exceeding +/−1 GHz, as found by Spice simulation plots in FIG. 28a and FIG. 28b. These figures show the simulation of the baseband signal BB(t) and the VCO tuning voltage $V_T$, respectively, during frequency and phase acquisition of the PLL circuit of FIG. 27, when the VCO from initial frequency of 2 GHz locks to a reference frequency of 1 GHz. The plots simulate an octave frequency change (from 2 GHz to 1 GHz) and show a successful frequency and phase acquisition, all accomplished in about 950 us. FIG. 29 shows Spice simulation of the same PLL circuit of FIG. 27, but when the VCO at 1.1 GHz locks to a reference frequency of 1 GHz. In this case, the frequency and phase locking of the 100 MHz step completes in about 60 us.

FIG. 30 is Spice simulation plot of the FD gain vs. offset frequency (i.e. The offset of VCO frequency with respect to the reference frequency) of the present invention PFD in circuit of FIG. 27, utilizing the RC implementation of the delay element. The gain is normalized to a value of ⅛·Kmax, where Kmax is the maximum value of the gain factor K in equation (76). Due to RC circuit's amplitude and phase dependency on frequency, both factor K and delay $\tau$ are the function of frequency. The simulation plot of the FD gain frequency response shows a peak around 80 MHz, which is close to the RC cut-off frequency of $1/(2\pi RC)$. The magnitude of the FD gain at this peak is about 0.4. The gain at frequencies below cut-off has an up-slope of 20 dB/Decade, i.e., it is increasing proportionally with the offset frequency, while above the cut-off, the gain has a down-slope of 40 dB/Decade, i.e., it's inversely proportional to the square of the offset frequency. The present invention FD circuit of FIG. 27 will be able to acquire any frequency for which the FD gain per FIG. 30 is above a minimum threshold, specific to a PLL loop design. This threshold will depend on the total available loop gain and any possible DC offsets in the loop. The lower acquisition frequency point need not be below the PLL loop bandwidth corner, because once inside the LBW, the PD will take over from the FD and bring the loop to a final phase-lock. The RC time constant is chosen such that the frequency response of the FD curve is centered, i.e., optimally positioned in the desired frequency acquisition range, so that both the lower and the upper desired frequency points have the FD gain above the threshold. The PLL example of FIG. 27 was designed with the FD loop gain threshold below 0.01, thus achieving the lower acquisition frequency below 1 MHz, and the upper above 1 GHz, both points being above this threshold line on the graph. The upper offset frequency of 1 GHz (relative to the reference frequency of 1 GHz) presents an impressive, one octave acquisition capability of this simple form of the present invention PFD. In practical realization of the RC delay, the circuit parasitics may affect the performance and should be taken into consideration. Particularly the self-resonance frequency due to parasitic inductance of the capacitor may adversely affect the high frequency FD gain and potentially limit the acquisition range. This should not be a problem in IC implementation, and in discrete implementation, capacitors with higher resonance frequency, or paralleling multiple capacitors can be used.

The invention claimed is:

1. A method for providing frequency discrimination/comparison and phase detection/comparison using complex single side-band (SSB) down conversion, the method comprising:

receiving a local oscillator (LO) of frequency $\omega_o$ and phase $\theta(t)$, in-phase and quadrature signals;

receiving a carrier signal of carrier frequency $\omega_c$ and phase $\phi(t)$, in-phase and quadrature signals;

multiplying each of said in-phase and quadrature LO signals with each of said in-phase and quadrature carrier signals, thereby generating four converted signals;

combining in two pairs said four converted signals, to produce the in-phase LSB signal and the quadrature LSB signal;

delaying one of said LSB signals by a time delay $\tau$ to produce a delayed LSB signal;

multiplying said delayed LSB signal with said other LSB signal, to produce the baseband signal BB(t); and outputting said baseband signal BB(t), wherein said signal BB(t) has a DC voltage component substantially proportional to a frequency difference $\omega_c - \omega_o$, and when this frequency difference is substantially near or equal to zero then said output signal BB(t) assumes a DC voltage substantially proportional to a phase difference $\phi(t) - \theta(t)$.

2. The method of claim 1 wherein the receiving a local oscillator (LO) in-phase and quadrature signals includes receiving and splitting a local oscillator (LO) signal to two signal components: the in-phase component and the quadrature component.

3. The method of claim 1 wherein the receiving carrier in-phase and quadrature signals includes receiving and splitting an input carrier signal to two signal components: the in-phase component and the quadrature component.

4. The method of claim 1 comprising an operation of adding or subtracting to effect the combining in two pairs said four converted signals.

5. The method of claim 1 further comprising controlling said time delay $\tau$.

6. The method of claim 5, further comprising utilizing said output BB(t) to control said time delay $\tau$ in a closed-loop circuit.

7. A device for providing frequency discrimination/comparison and phase detection/comparison using complex single side-band (SSB) down conversion, the device comprising:
   an in-phase local oscillator (LO) input providing an in-phase LO signal of frequency $\omega_o$ and phase $\theta(t)$;
   a quadrature local oscillator (LO) input providing a quadrature component of said LO signal;
   an in-phase carrier frequency signal input providing an in-phase carrier signal component of frequency $\omega_c$ and phase $\phi(t)$;
   a quadrature carrier frequency signal input providing a quadrature signal component of said carrier signal;
   four multiplying elements multiplying respective ones of said in-phase and quadrature LO components with separate ones of said in-phase and quadrature input carrier components, generating two pairs of different converted input signals;
   two combiners to combine respective ones of said two pairs of said converted signals, producing in-phase and quadrature un-delayed lower single sideband (LSB) signals;
   a delay element delaying one of the two said un-delayed LSB signals by a time delay $\tau$, to generate one delayed LSB signal;
   a fifth multiplying element multiplying said delayed LSB signal with the other said un-delayed LSB signal, to generate the baseband signal BB(t); and
   an output port outputting said baseband signal BB(t), wherein said signal BB(t) has a DC voltage component substantially proportional to a frequency difference $\omega_c - \omega_o$, and as this frequency difference approaches zero then said output signal BB(t) assumes a DC voltage substantially proportional to the phase difference $\phi(t) - \theta(t)$.

8. The device of claim 7 further comprising a splitter circuit for receiving a local oscillator (LO) signal and splitting the LO signal into an in-phase and quadrature signal components.

9. The device of claim 7 further comprising a splitter circuit for receiving a carrier signal and splitting the carrier signal into an in-phase and quadrature signal components.

10. The device of claim 7 wherein the two combiners use adding or subtracting means to effect the combining said two pairs of said converted signals.

11. The device of claim 7 further comprising an adjustable time delay element having a control input to control the parameters of said time delay element.

12. The device of claim 11, comprising circuitry to couple said control input of said adjustable time delay element to said output BB(t), thereby providing a closed-loop adjustment of said time delay element.

13. The device of claim 7, thus further comprising:
   a local oscillator (LO) reference signal;
   a first splitter splitting the LO reference signal into an in-phase LO component and a quadrature LO component, said in-phase LO component coupled to said in-phase LO input of said device, said quadrature LO component coupled to said quadrature LO input of said device;
   a Voltage Controlled Oscillator (VCO) having one tuning voltage input port ($V_T$), and one output port providing a signal Vosc;
   a second splitter splitting said Vosc signal into an in-phase Vosc component and a quadrature Vosc component, said in-phase Vosc component coupled to said in-phase carrier input of said device, said quadrature Vosc component coupled to said quadrature carrier input of said device, and
   a loop filter, having one input coupled to said baseband output BB(t) of said device, and one output coupled to said tuning voltage input $V_T$ of said VCO, the device thereby providing a frequency-discriminator and phase-detector (PFD) function in a phase-locked loop (PLL) system.

14. The device of claim 7, further comprising:
   a local oscillator (LO) reference input providing a LO reference signal;
   a first splitter splitting the LO reference signal into an in-phase LO component and a quadrature LO component, said in-phase LO component coupled to said in-phase LO input of the device, said quadrature LO component coupled to said quadrature LO input of the device;
   a Voltage Controlled Oscillator (VCO) having one tuning voltage input port ($V_T$), and one output port providing a signal Vosc;
   a second splitter splitting said Vosc signal into an in-phase Vosc component and a quadrature Vosc component, said in-phase Vosc component coupled to said in-phase carrier input of the device, said quadrature Vosc component coupled to said quadrature carrier input of the device;
   an input modulating signal $V_{mod}$;
   a combiner to combine said baseband signal BB(t) of the device with said input modulating signal $V_{mod}$, to produce an error signal; and
   a loop filter, having one input coupled to said error signal, and one output coupled to said tuning voltage input $V_T$ of said VCO, thereby providing a linearization function in an FM modulator system.

15. A feed-back system for providing phase noise-reduction (clean-up) of a Voltage Controlled Oscillator (VCO) output signal, comprising:
   a VCO generating a signal Vo of frequency $\omega_c$, having a tuning voltage input $V_T$, and separated into in-phase and quadrature Vo signal components;
   a local oscillator (LO) providing an LO signal of frequency $\omega_o$ close or equal to $\omega_c + \pi \cdot n/\tau$, where $\tau$ is a delay time and n is an integer $0, \pm 1, \pm 2, \ldots$, and separated into in-phase and quadrature LO signal components;
   four multiplying elements multiplying said in-phase and quadrature LO signal components with respective ones of said in-phase and quadrature Vo signal components, generating two pairs of converted signals;
   a first and a second combiner to combine respective ones of said two pairs of converted signals, producing an un-delayed lower single sideband (LSB) in-phase and un-delayed LSB quadrature signals;
   a first delay element having a time delay comparable to $\tau$, coupled to said un-delayed in-phase LSB signal, to provide a delayed LSB in-phase signal;
   a second delay element having a time delay comparable to $\tau$, coupled to said un-delayed quadrature LSB signal, to provide a delayed LSB quadrature signal;
   a fifth multiplying element for multiplying said delayed LSB in-phase signal with said un-delayed LSB quadrature signal, generating a first multiplication product;
   a sixth multiplying element for multiplying said delayed LSB quadrature signal with said un-delayed LSB in-phase signal, generating a second multiplication product;

a third combiner to combine said first and second multiplication products, to produce a demodulated baseband signal BB(t); and a filter having one input port coupled to said demodulated baseband signal BB(t), and an output port coupled to said tuning voltage input $V_T$ of said VCO.

16. The feed-back system of claim 15, comprising the first and second combiners each including a circuit to add or subtract the respective ones of said two pairs of said converted signals.

17. A feed-back system for providing phase noise-reduction (clean-up) of an input signal, comprising:

an input signal having a frequency $\omega_c$;

a phase modulator having a first input port, a second input port and one output port, the first input port coupled to said input signal, and the output port providing a signal Vo, and separated into in-phase and quadrature Vo signal components;

a local oscillator (LO) providing an LO signal of frequency $\omega_0$ close or equal to $\omega_c + \pi \cdot n/\tau$, where $\tau$ is a delay time and n is an integer $0, \pm 1, \pm 2, \ldots$, and separated into in-phase and quadrature LO signal components;

four multiplying elements multiplying said in-phase and quadrature LO signal components with respective ones of said in-phase and quadrature Vo signal components, generating two pairs of converted signals;

a first and a second combiner to combine respective ones of said two pairs of converted signals, producing an un-delayed lower single sideband (LSB) in-phase and un-delayed LSB quadrature signals;

a first delay element having a time delay comparable to $\tau$, coupled to said un-delayed in-phase LSB signal, to provide a delayed LSB in-phase signal;

a second delay element having a time delay comparable to $\tau$, coupled to said un-delayed quadrature LSB signal, to provide a delayed LSB quadrature signal;

a fifth multiplying element for multiplying said delayed LSB in-phase signal with said un-delayed LSB quadrature signal, generating a first multiplication product;

a sixth multiplying element for multiplying said delayed LSB quadrature signal with said un-delayed LSB in-phase signal, generating a second multiplication product;

a third combiner to combine said first and second multiplication products, to produce a demodulated baseband signal BB(t); and a filter having one input port coupled to said demodulated baseband signal BB(t), and an output port coupled to said second input of said phase modulator.

18. The feed-back system of claim 17, comprising the first and second combiners each including a circuit to add or subtract the respective ones of said two pairs of said converted signals.

19. A feed-forward system for providing phase noise-reduction (clean-up) of an input signal, comprising:

A signal Vc having a frequency $\omega_c$;

a phase modulator having a first input port, a second input port and one output port, the first input port coupled to said signal Vc and separated into in-phase and quadrature Vc signal components, and the output port providing a signal Vo;

a local oscillator (LO) providing an LO signal of frequency $\omega_0$ close or equal to $\omega_c + \pi \cdot n/\tau$, where $\tau$ is a delay time and n an integer $0, \pm 1, \pm 2, \ldots$, and separated into in-phase and quadrature LO signal components;

four multiplying elements multiplying said in-phase and quadrature LO signal components with respective ones of said in-phase and quadrature Vc signal components, generating two pairs of converted signals;

a first and a second combiner to combine respective ones of said two pairs of converted signals, producing an un-delayed lower single sideband (LSB) in-phase and un-delayed LSB quadrature signals;

a first delay element having a time delay comparable to $\tau$, coupled to said un-delayed in-phase LSB signal, to provide a delayed LSB in-phase signal;

a second delay element having a time delay comparable to $\tau$, coupled to said un-delayed quadrature LSB signal, to provide a delayed LSB quadrature signal;

a fifth multiplying element for multiplying said delayed LSB in-phase signal with said un-delayed LSB quadrature signal, generating a first multiplication product;

a sixth multiplying element for multiplying said delayed LSB quadrature signal with said un-delayed LSB in-phase signal, generating a second multiplication product;

a third combiner to combine said first and second multiplication products, to produce a demodulated baseband signal BB(t); and a filter having one input port coupled to said demodulated baseband signal BB(t), and an output port coupled to said second input of said phase modulator.

20. The feed-forward system of claim 19, comprising the first and second combiners each including a circuit to add or subtract the respective ones of said two pairs of said converted signals.

21. A method for providing frequency discrimination/comparison and phase detection/comparison using down conversion, the method comprising:

receiving a local oscillator (LO) of frequency $\omega_o$ and phase $\theta(t)$, in-phase and quadrature signals;

receiving a carrier signal of carrier frequency $\omega_c$ and phase $\phi(t)$, in-phase and quadrature signals;

multiplying said in-phase LO signal with said in-phase carrier signal, and said quadrature LO signal with said quadrature carrier signal, thereby generating two converted signals;

combining said two converted signals, to produce one LSB converted signal;

multiplying one of said quadrature carrier signal or in-phase carrier signal with one of said in-phase LO signal or quadrature LO signal, thereby generating one double side-band (DSB) converted signal;

delaying one of said DSB or LSB converted signals by a time delay $\tau$ to produce a delayed signal;

multiplying said delayed signal with the un-delayed one of said DSB or LSB converted signals, to produce the baseband signal BB(t); and outputting said baseband signal BB(t), wherein said signal BB(t) has a DC voltage component substantially proportional to a frequency difference $\omega_c - \omega_o$, and when this frequency difference is substantially near or equal to zero then said output signal BB(t) assumes a DC voltage substantially proportional to a phase difference $\phi(t) - \theta(t)$.

22. The method of claim 21 wherein the receiving a local oscillator (LO) in-phase and quadrature signals includes receiving and splitting a local oscillator (LO) signal to two signal components: the in-phase component and the quadrature component.

23. The method of claim 21 wherein the receiving carrier in-phase and quadrature signals includes receiving and splitting an input carrier signal to two signal components: the in-phase component and the quadrature component.

24. A method for providing frequency discrimination/comparison and phase detection/comparison using frequency conversion, the method comprising:
- receiving a local oscillator (LO) of frequency $\omega_o$ and phase $\theta(t)$;
- receiving a carrier signal of carrier frequency $\omega_c$ and phase $\phi(t)$, in-phase and quadrature signals;
- multiplying said LO signal with said in-phase carrier signal, thereby generating a first double side-band (DSB) converted signal;
- multiplying said LO signal with said quadrature carrier signal, thereby generating a second DSB converted signal;
- delaying one of either first or second DSB converted signals by a time delay $\tau$ to produce a delayed signal;
- multiplying said delayed signal with other un-delayed said first or second DSB signal, to produce a baseband signal BB(t); and
- outputting said baseband signal BB(t), wherein said signal BB(t) has a DC voltage component substantially proportional to a frequency difference $\omega_c - \omega_o$, and when this frequency difference is substantially near or equal to zero then said output signal BB(t) assumes a DC voltage substantially proportional to a phase difference $\phi(t) - \theta(t)$.

25. The method of claim 24 wherein the receiving a carrier in-phase and quadrature signals includes receiving and splitting a carrier signal to two signal components: the in-phase component and the quadrature component.

26. A device for providing frequency discrimination/comparison and phase detection/comparison using simple conversion, the device comprising:
- a local oscillator (LO) input providing a signal of frequency $\omega_o$ and phase $\theta(t)$;
- an in-phase carrier signal input providing an in-phase carrier signal of frequency $\omega_c$ and phase $\phi(t)$;
- a quadrature carrier frequency signal input providing a quadrature carrier signal component of said carrier signal;
- a multiplying element multiplying said LO signal with said in-phase carrier signal, thereby generating a first double side-band (DSB) converted signal;
- a multiplying element multiplying said LO signal with said quadrature carrier signal component, thereby generating a second DSB converted signal;
- a resistor-capacitor (RC) delay element delaying one of either first or second DSB converted signals to produce a delayed signal;
- a multiplying element multiplying said delayed signal with other un-delayed said first or second DSB signal, to produce a baseband signal BB(t); and
- an output port outputting said baseband signal BB(t), wherein said signal BB(t) has a DC voltage component substantially proportional to a frequency difference $\omega_c - \omega_o$, and when this frequency difference is substantially near or equal to zero then said output signal BB(t) assumes a DC voltage substantially proportional to a phase difference $\phi(t) - \theta(t)$.

27. The device of claim 26 further comprising a splitter circuit for receiving a carrier signal and splitting the carrier signal into an in-phase and quadrature signal components.

28. The device of claim 26, further comprising:
- a local oscillator (LO) input providing a LO reference signal, coupled to the local oscillator (LO) input of the device;
- a Voltage Controlled Oscillator (VCO) having one tuning voltage input port ($V_T$), and one output port providing a signal Vosc;
- a splitter splitting said Vosc signal into an in-phase Vosc component and a quadrature Vosc component, said in-phase Vosc component coupled to said in-phase carrier input of the device, said quadrature Vosc component coupled to said quadrature carrier input of the device; and
- a loop filter, having one input coupled to baseband signal output BB(t) of the device, and one output coupled to said tuning voltage input $V_T$ of said VCO, thereby creating a closed loop system able to provide both frequency acquisition and phase lock.

* * * * *